United States Patent
Wu et al.

(10) Patent No.: US 12,062,539 B2
(45) Date of Patent: *Aug. 13, 2024

(54) SEMICONDUCTOR-ON-INSULATOR (SOI) SUBSTRATE AND METHOD FOR FORMING

(71) Applicant: Taiwan Semiconductor Manufacturing Company, Ltd., Hsin-Chu (TW)

(72) Inventors: Cheng-Ta Wu, Shueishang Township (TW); Chia-Ta Hsieh, Tainan (TW); Kuo Wei Wu, Tainan (TW); Yu-Chun Chang, Tainan (TW); Ying Ling Tseng, Kaohsiung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/328,102

(22) Filed: Jun. 2, 2023

(65) Prior Publication Data

US 2023/0307231 A1 Sep. 28, 2023

Related U.S. Application Data

(63) Continuation of application No. 17/701,103, filed on Mar. 22, 2022, now Pat. No. 11,705,328, which is a
(Continued)

(51) Int. Cl.
*H01L 21/02* (2006.01)
*H01L 21/762* (2006.01)
(Continued)

(52) U.S. Cl.
CPC .. *H01L 21/02359* (2013.01); *H01L 21/76251* (2013.01); *H01L 21/84* (2013.01); *H01L 27/1203* (2013.01); *H01L 29/0649* (2013.01)

(58) Field of Classification Search
None
See application file for complete search history.

(56) References Cited

U.S. PATENT DOCUMENTS 5,393,686 A 2/1995 Yeh et al.
7,528,049 B2 5/2009 Ikeda et al.
(Continued)

OTHER PUBLICATIONS

Non-Final Office Action dated Jul. 21, 2021 for U.S. Appl. No. 16/943,198.
(Continued)

*Primary Examiner* — Hsien Ming Lee
(74) *Attorney, Agent, or Firm* — Eschweiler & Potashnik, LLC

(57) ABSTRACT

Various embodiments of the present application are directed towards a semiconductor-on-insulator (SOI) substrate. The SOI substrate includes a handle substrate; a device layer overlying the handle substrate; and an insulator layer separating the handle substrate from the device layer. The insulator layer meets the device layer at a first interface and meets the handle substrate at a second interface. The insulator layer comprises a getter material having a getter concentration profile. The handle substrate contains getter material and has a handle getter concentration profile. The handle getter concentration profile has a peak at the second interface and a gradual decline beneath the second interface until reaching a handle getter concentration.

20 Claims, 12 Drawing Sheets

Related U.S. Application Data continuation of application No. 16/943,198, filed on Jul. 30, 2020, now Pat. No. 11,289,330.

(60) Provisional application No. 62/907,976, filed on Sep. 30, 2019.

(51) Int. Cl.
  *H01L 21/84* (2006.01)
  *H01L 27/12* (2006.01)
  *H01L 29/06* (2006.01)

(56) References Cited

U.S. PATENT DOCUMENTS

| | | | |
|---|---|---|---|
| 11,289,330 B2 | 3/2022 | Wu et al. | |
| 11,705,328 B2 * | 7/2023 | Wu | H01L 21/84 |
| | | | 257/506 |
| 2008/0020541 A1 | 1/2008 | Keda et al. | |
| 2008/0308897 A1 | 12/2008 | Kakehata et al. | |
| 2009/0197391 A1 | 8/2009 | Ohnuma et al. | |
| 2009/0203191 A1 | 8/2009 | Ohnuma et al. | |
| 2010/0062546 A1 | 3/2010 | Endo et al. | |
| 2011/0147817 A1 | 6/2011 | Schulze et al. | |
| 2011/0163381 A1 | 7/2011 | Yamazaki | |

OTHER PUBLICATIONS

Notice of Allowance dated Nov. 22, 2021 for U.S. Appl. No. 16/943,198.
Non-Final Office Action dated Nov. 21, 2022 for U.S. Appl. No. 17/701,103.
Notice of Allowance dated Mar. 10, 2023 for U.S. Appl. No. 17/701,103.

* cited by examiner

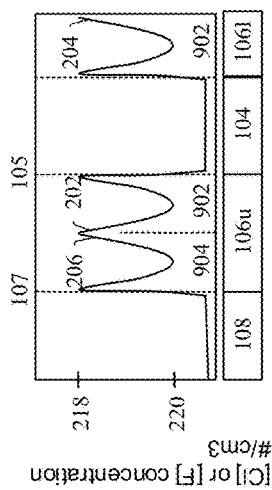
Fig. 2A
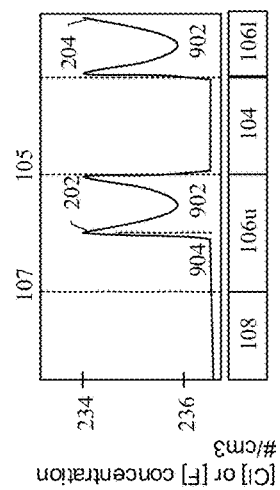
Fig. 2B
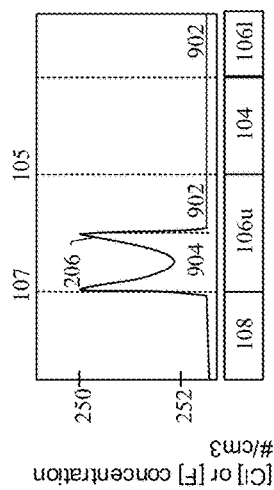
Fig. 2C
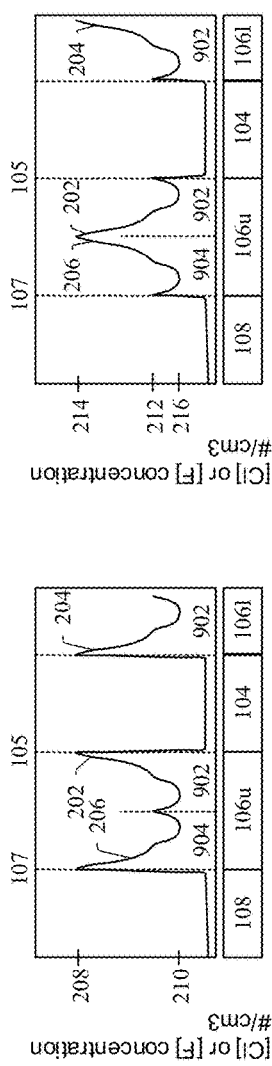
Fig. 2D
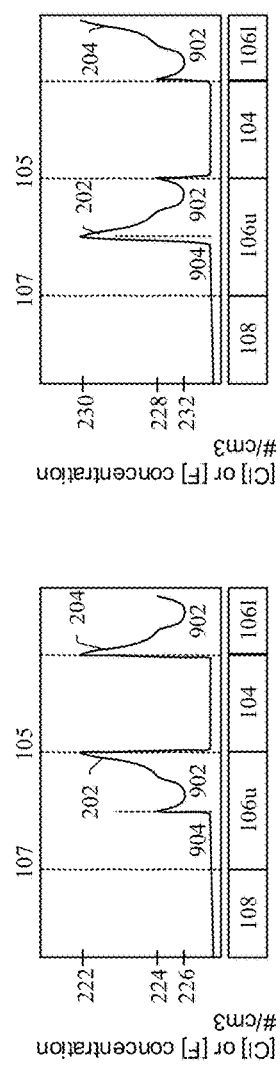
Fig. 2E
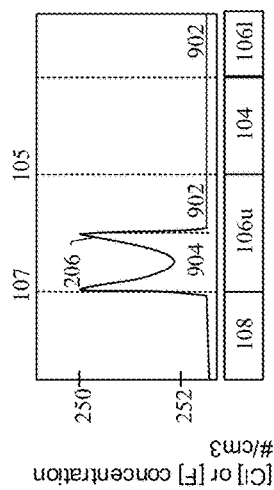
Fig. 2F
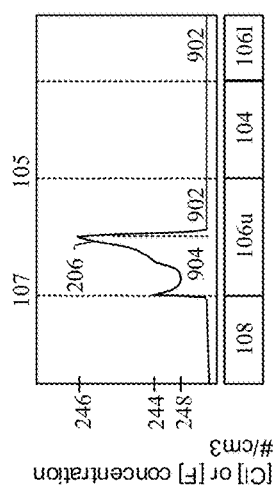
Fig. 2G
Fig. 2H
Fig. 2I

SEMICONDUCTOR-ON-INSULATOR (SOI) SUBSTRATE AND METHOD FOR FORMING

REFERENCE TO RELATED APPLICATIONS

This application is a Continuation of U.S. application Ser. No. 17/701,103, filed on Mar. 22, 2022, which is a Continuation of U.S. application Ser. No. 16/943,198, filed on Jul. 30, 2020 (now U.S. Pat. No. 11,289,330, issued on Mar. 29, 2022), which claims the benefit of U.S. Provisional Application No. 62/907,976, filed on Sep. 30, 2019. The contents of the above-referenced Patent Applications are hereby incorporated by reference in their entirety.

BACKGROUND

Integrated circuits have traditionally been formed on bulk semiconductor substrates. In recent years, semiconductor-on-insulator (SOI) substrates have emerged as an alternative to bulk semiconductor substrates. An SOI substrate comprises a handle substrate, an insulator layer overlying the handle substrate, and a device layer overlying the insulator layer. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2I illustrate cross-sectional views depicting various getter concentration profiles of the SOI substrate of FIG. 1.

DETAILED DESCRIPTION

Figure 1:
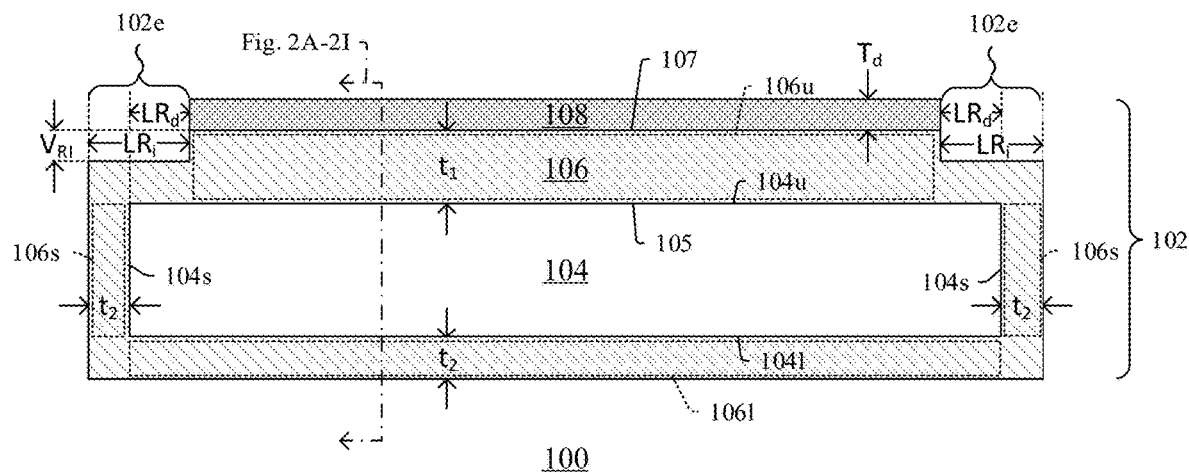
FIG. 1 illustrates a cross-sectional view of some embodiments of a semiconductor-on-insulator (SOI) substrate with a getter material disposed in the insulator layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the present application are directed towards methods for forming an SOI substrate, and for chips that include such an SOI substrate. As appreciated in some aspects of the present disclosure, some SOI substrates include an insulator layer that includes mobile metal contaminants, such as sodium and/or potassium. These mobile metal contaminants may inadvertently enter the insulator layer of the SOI substrate during processing, and tend to induce a higher leakage current and/or reduce a breakdown voltage in the insulator layer. Thus, to mitigate the effects of these metal contaminants, some aspects of the present disclosure include an SOI substrate where the insulator layer is fortified with a getter material having a getter concentration profile. The getter material can comprise a halogen, such as fluorine (F) or chlorine (Cl) for example. The getter material binds to the mobile metal contaminants to reduce current leakage and/or increase a breakdown voltage in the insulator layer. Thus, the presence of the getter material in the insulator layer binds these metal contaminants, thereby reducing leakage current and/or increasing the breakdown voltage of the insulator layer.

With reference to FIG. 1, a cross-sectional view 100 of some embodiments of a SOI substrate 102 is provided. The SOI substrate 102 includes a handle substrate 104, insulator layer 106 overlying the handle substrate 104, and a device layer 108 overlying the insulator layer 106. The insulator layer 106 separates the handle substrate 104 from the device layer 108. The insulator layer 106 includes an upper insulating region 106u covering an upper surface 104u of the handle substrate 104 to separate the upper surface 104u of the handle substrate 104 from the device layer 108. In some embodiments, the insulator layer 106 also includes a lower insulating region 106l covering a lower surface 104l of the handle substrate 104, and sidewall insulating regions 106s covering sidewalls 104s of the handle substrate 104. In some embodiments, the upper insulating region 106u has a first thickness t1 as measured between the upper surface 104u of the handle substrate 104 and the device layer 108, while the lower insulating region 106l and sidewall insulating regions 106s have a second thickness t2. In some embodiments, the first thickness t1 is greater than the second thickness t2.

In some embodiments of FIG. 1, the insulator layer 106 comprises a getter material having a getter concentration profile. The getter material can comprise a halogen, such as fluorine (F) or chlorine (Cl) for example. The getter material binds to mobile metal contaminants, such as alkali metals including sodium (Na) and/or potassium (K) that arise in the insulator layer 106 during the manufacture and/or processing of the SOI substrate. But for the getter material, these metal contaminants would induce a higher leakage current and/or reduce a breakdown voltage in the insulator layer 106. Thus, the presence of the getter material in the insulator layer 106 binds these metal contaminants, thereby reducing leakage current and/or increasing the breakdown voltage of the insulator layer.

Figure 9:
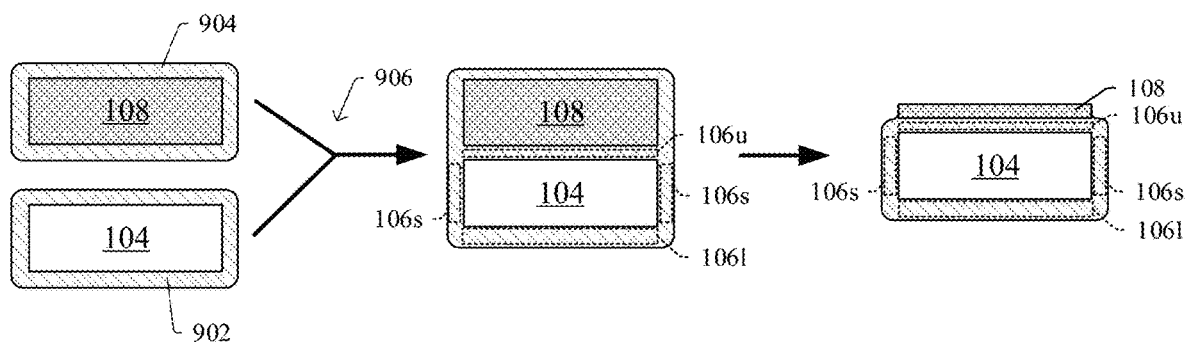
FIG. 9 illustrates a manufacturing methodology in accordance with some embodiments of FIG. 1 and FIGS. 2A-2I.

In some cases, the embodiments of FIG. 1 can be formed according to FIG. 9, wherein a first insulating layer 902 is formed about a handle substrate 104, and a second insulating layer 904 is formed about a device substrate 108. The handle substrate 104 and the device substrate 108 are then bonded together (906) so the first insulating layer 902 and second insulating layer 904 contact one another to establish the upper insulating region 106u, sidewall insulating regions 106s, and lower insulating region 106l. In some embodiments, sidewall portions and an upper surface portion of the second insulating layer 904 around the device substrate 108 are removed, for example by an etch and a chemical mechanical planarization or grinding operation (rightmost portion of FIG. 9). More particularly, in FIG. 9, at least one of the first insulating layer 902 and the second insulating layer 904 can be formed to include a getter material with a getter concentration profile. Thus in some embodiments, only the first insulating layer 902 includes a getter material while the second insulating layer 904 does not exhibit a getter material; while in other embodiments, only the second insulating layer 904 includes a getter material while the first insulating layer 902 does not exhibit a getter material. In still other embodiments, the first insulating layer 902 and the second insulating layer 904 both include getter material.

In viewing FIG. 1 together with FIG. 9, it can be appreciated that the getter concentration profile can take various forms depending in the implementation, as now described in FIGS. 2A-2I. FIGS. 2A-2I show various non-limiting examples of getter concentration profiles that can correspond to various embodiments of FIG. 1 that have been manufactured consistent with FIG. 9.

In FIGS. 2A-2C, both the first insulating layer 902 surrounding the handle substrate 104 and the second insulating layer 904 surrounding the device substrate 108 each include getter material. In FIGS. 2A-2C, the first insulating layer 902 surrounding the handle substrate 104 exhibits a first getter concentration profile, which is generally symmetric about a central region of the handle substrate 104. Thus, the first insulating layer 902 exhibits the first getter concentration profile, which includes an upper region having an upper getter concentration profile 202, and a bottom region having a bottom getter concentration profile 204. The second insulating layer 904 surrounding the device substrate 108 exhibits a second getter concentration profile 206 that can be the same or different from the first getter concentration profile. Thus, in the examples of FIG. 2A-2C, the upper region of the first insulator layer 902 and the second insulating layer 904 collectively establish the upper insulating region 106u of FIG. 1.

More particularly, in FIG. 2A, an overall getter concentration profile for the upper insulating region 106u has a first peak concentration 208 at a first interface 105, a second peak concentration 208 at a second interface 107, and a trough concentration 210 at a location between the first interface and the second interface. In FIG. 2A's example, the first peak concentration 208 is equal to the second peak concentration 208, and the trough concentration 210 is less than each of the first peak concentration 208 and the second peak concentration 208. The lower region of the first insulating layer 106l has a getter concentration profile 204 that is generally symmetric with the getter concentration profile 202 of the upper insulating region 106u of the first insulating layer 902. In some embodiments, the first peak concentration 208 and the second peak concentration 208 each range between $1 \times 10^{18}$ atoms/cm3 and $5 \times 10^{21}$ atoms/cm3 of chlorine or fluorine, and the trough concentration 210 ranges between $1 \times 10^{14}$ atoms/cm3 and $2 \times 10^{17}$ atoms/cm3 of chlorine or fluorine. This getter concentration profile 204 provides high concentration of chlorine and/or fluorine atoms at the interfaces 108/106 and 104/106. These chlorine and/or fluorine ions are mobile metal ions and reduce the source of metal ions at the interfaces (e.g., Na+ (ion)+Cl− (ion)→NaCl (stable compound)), and thereby reduce the interface leakage and improve the breakdown voltage of the first insulating layer 902.

In FIG. 2B, an overall getter concentration profile for the upper insulating region 106u again has a first peak concentration 212 at the first interface 105, a second peak concentration 212 at the second interface 107, and a trough concentration 216 at a location between the first interface 105 and the second interface 107. However, in FIG. 2B, the overall getter concentration profile has a maximum peak concentration 214 at a central region of the upper insulating region 106u. Defects in the interfaces tend to trap metal ions, resulting in a leakage path. The concentration [Cl][F] in FIG. 2A has a higher probability to capture metal ions in defects at the interfaces, and thus, improves the breakdown voltage of the upper insulating region 106u. In FIG. 2A's example, the first peak concentration 212 is equal to the second peak concentration 212, and the trough concentration 216 is less than each of the first peak concentration 212 and the second peak concentration 212. The lower insulating region 106l of the first insulating layer 902 has a getter concentration profile 204 that is again generally symmetric with the getter concentration profile 202 of the upper insulating region 106u of the first insulating layer 902. In some embodiments, the first peak concentration 212 and the second peak concentration 212 each range between $1 \times 10^{18}$ atoms/cm3 and $5 \times 10^{21}$ atoms/cm3 of chlorine or fluorine, and the trough concentration 216 ranges between $1 \times 10^{14}$ atoms/cm3 and $2 \times 10^{17}$ atoms/cm3 of chlorine or fluorine.

In FIG. 2C, an overall getter concentration profile for the upper insulating region 106u again has a first peak concentration 218 at the first interface 105, a second peak concentration 218 at the second interface 107, and a trough concentration 220 at a location between the first interface 105 and the second interface 107. However, in FIG. 2C, the overall getter concentration profile has a maximum peak concentration 218 at a central region of the upper insulating region 106u, with the maximum peak concentration 218 at the central region equal to the first peak concentration 218 and the second peak concentration 218. The lower insulating region 106l of the first insulating layer 902 has a getter concentration profile 204 that is again generally symmetric with the getter concentration profile 202 for the upper insulating region 106u of the first insulating layer 902. In other embodiments, the first and second peak concentrations, and trough concentration can each be equal, and the chlorine or fluorine concentration can be flat over the upper insulating region 106u, the lower insulating region 106l, and/or the first insulating layer 902, and/or the second insulating layer 904. In some embodiments, the first peak concentration 218 and the second peak concentration 218 each range between $1\times10^{18}$ atoms/cm3 and $5\times10^{21}$ atoms/cm3 of chlorine or fluorine, and the trough concentration 220 ranges between $1\times10^{14}$ atoms/cm3 and $2\times10^{17}$ atoms/cm3 of chlorine or fluorine.

In FIGS. 2D-2F, only the first insulating layer 902 includes getter material, and the second insulating layer 904 does not include getter material. This can streamline processing of the device substrate 108, and thereby provides a good solution in some regards as it streamlines processing while still providing a SOI substrate with reduced leakage and enhanced voltage breakdown because the getter material binds metal contaminants that otherwise might adversely impact leakage and/or breakdown voltage. In FIG. 2D, the first peak concentration 222 is greater than the second peak concentration 224, and a trough concentration 226 is less than each of the first peak concentration 222 and second peak concentration 224. In FIG. 2E, the first peak concentration 228 is less than the second peak concentration 230, and a trough concentration 232 is less than each of the first peak concentration 228 and second peak concentration 230. In FIG. 2F, the first peak concentration 234 is equal to the second peak concentration 234, and a trough concentration 236 is less than each of the first peak concentration 234 and second peak concentration 234. In some embodiments, the first peak concentration 222, 230, 234 and the second peak concentration 224, 228, and/or 234 each range between $1\times10^{18}$ atoms/cm3 and $5\times10^{21}$ atoms/cm3 of chlorine or fluorine, and the trough concentration 226, 232, and/or 236 each ranges between $1\times10^{14}$ atoms/cm3 and $2\times10^{17}$ atoms/cm3 of chlorine or fluorine.

In FIGS. 2G-2I, only the second insulating layer 904 includes getter material, and the first insulating layer 902 does not include getter material. This can streamline processing of the handle substrate 104, and thereby provides a good solution in some regards as it streamlines processing while still providing a SOI substrate with reduced leakage and enhanced voltage breakdown because the getter material binds metal contaminants that otherwise might adversely impact leakage and/or breakdown voltage. In FIG. 2G, the first peak concentration 238 is greater than the second peak concentration 240, and a trough concentration 242 is less than each of the first peak concentration 238 and second peak concentration 240. In FIG. 2H, the first peak concentration 244 is less than the second peak concentration 246, and a trough concentration 248 is less than each of the first peak concentration 244 and second peak concentration 246. In FIG. 2I, the first peak concentration 250 is equal to the second peak concentration 250, and a trough concentration 252 is less than each of the first peak concentration 250 and second peak concentration 250. In some embodiments, the first peak concentration 238, 246, and/or 250 and the second peak concentration 240, 244, and/or 250 each range between $1\times10^{18}$ atoms/cm3 and $5\times10^{21}$ atoms/cm3 of chlorine or fluorine, and the trough concentration 242, 248, and/or 252 each ranges between $1\times10^{14}$ atoms/cm3 and $2\times10^{17}$ atoms/cm3 of chlorine or fluorine.

Figure 3:
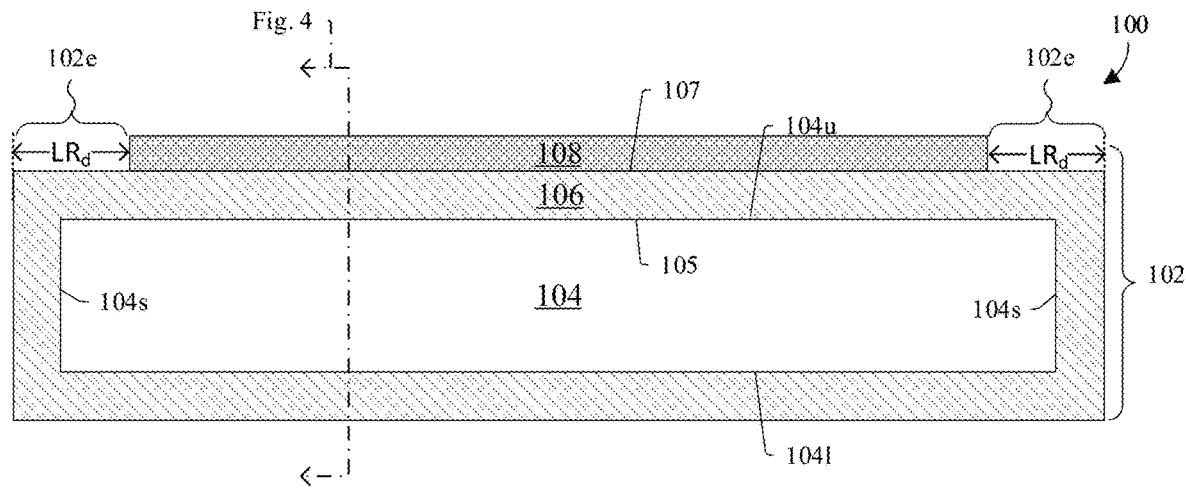
FIG. 3 illustrates a cross-sectional view of some embodiments of a SOI substrate with a getter material disposed in the insulator layer.

Turning now to FIG. 3, one can see another embodiment where the SOI substrate 102 includes a handle substrate 104, a device layer 108 overlying the handle substrate 104, and an insulator layer 106 separating the handle substrate 104 from the device layer 108. The insulator layer 106 meets the device layer 108 at a first interface 107 and meets the handle substrate 104 at a second interface 105. The second interface 105 corresponds to a point where the upper surface 104u of the handle substrate 104 meets the insulator layer 106.

Figure 4:
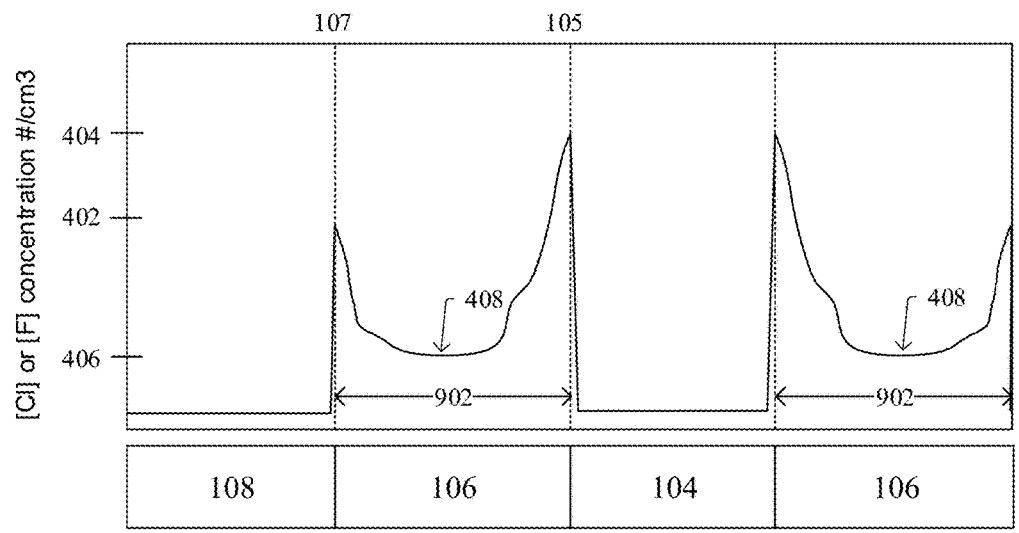
FIG. 4 illustrates a cross-sectional view depicting a getter concentration profile of the SOI substrate of FIG. 3.

As illustrated in FIG. 4, in some embodiments of FIG. 3, the insulator layer 106 comprises a getter material having a getter concentration profile. The getter concentration profile has a first peak concentration 402 at the first interface 107, a second peak concentration 404 at the second interface 105, and a trough concentration 406 at a location 408 between the first interface 105 and the second interface 107. The first peak concentration 402 is less than the second peak concentration 404, but in other embodiments could be greater than or equal to the second peak concentration 404. Further, as shown in FIG. 4, in some embodiments of FIG. 3, the getter material extends into a portion of the device layer 108 at a first concentration, and extends into a portion of the handle substrate 104 at a second concentration, the first concentration being less than the second concentration.

Figure 10:
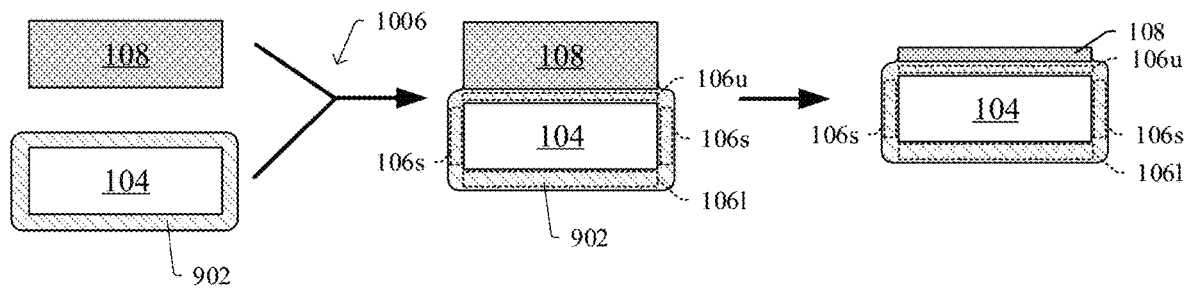
FIG. 10 illustrates a manufacturing methodology in accordance with some embodiments of FIG. 3 and FIG. 4.

In some cases, the embodiments of FIGS. 3-4 can be formed according to FIG. 10, wherein a first insulating layer 902 is formed about a handle substrate 104. The handle substrate 104 and the first insulating layer 902 are then bonded to a device substrate 108 (1006) so the first insulating layer 902 establishes the upper insulating region 106u, sidewall insulating regions 106s, and lower insulating region 106l. In some embodiments, an upper surface portion of the device substrate 108 is then removed, for example by an etch and/or a chemical mechanical planarization or grinding operation (rightmost portion of FIG. 10). More particularly, in FIG. 10, the first insulating layer 902 can be formed to include a getter material with a getter concentration profile, such as shown in FIG. 4. Although FIG. 4 shows an example doping concentration profile, other example doping concentrations, such as shown and/or described in FIGS. 2A-2I for example can alternatively be used in FIG. 4.

Figure 5:
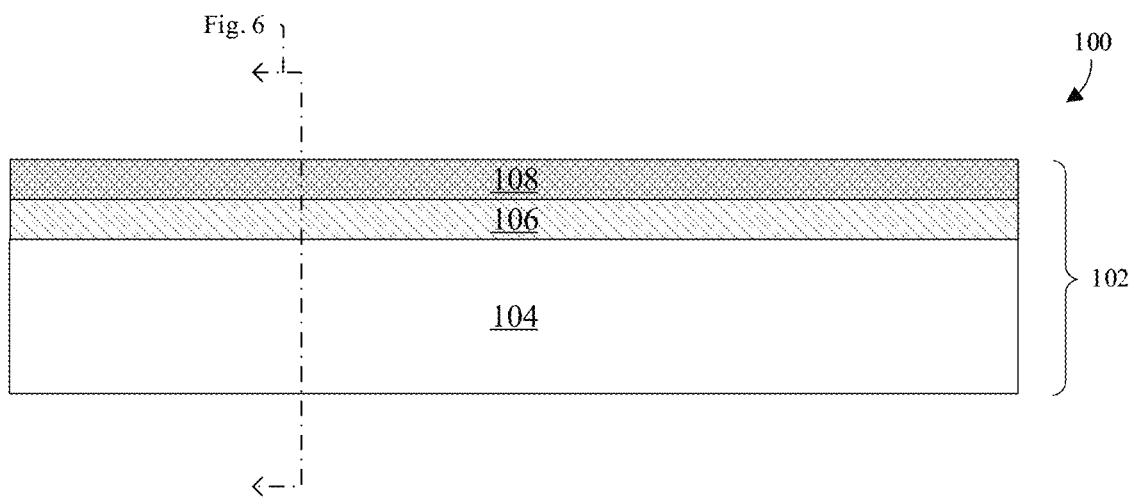
FIG. 5 illustrates a cross-sectional view of some embodiments of a SOI substrate with a getter material disposed in the insulator layer.

FIG. 5 shows another embodiment where the SOI substrate 102 includes a handle substrate 104, a device layer 108 overlying the handle substrate 104, and an insulator layer 106 separating the handle substrate 104 from the device layer 108. The insulator layer 106 is confined between the device layer 108 and the handle substrate 104, such that a lowermost surface of the insulator layer 106 corresponds to an uppermost surface of the handle substrate 104, and an uppermost surface of the insulator layer 106 corresponds to a lowermost surface of the device layer 108.

Figure 6:
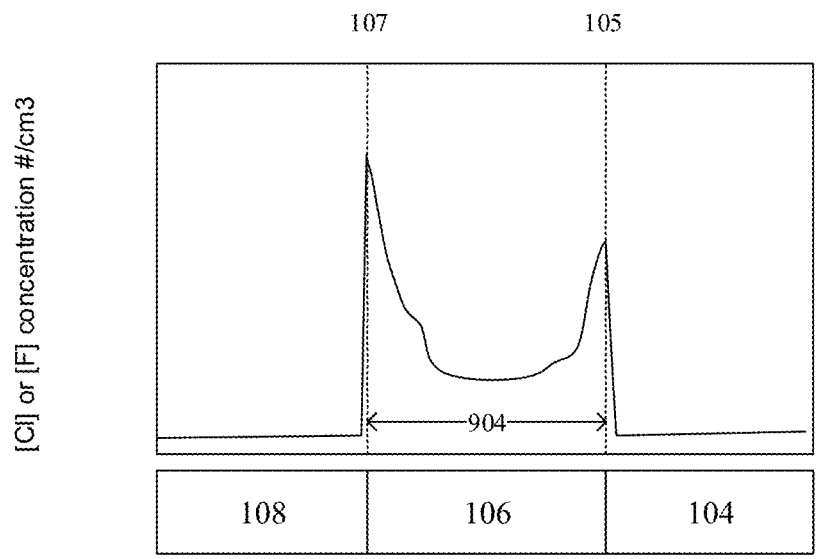
FIG. 6 illustrates a cross-sectional view depicting a getter concentration profile of the SOI substrate of FIG. 5.

As illustrated in FIG. 6, in some embodiments of FIG. 5, the insulator layer 106 comprises a getter material having a getter concentration profile. The getter concentration profile has a first peak concentration at the first interface 105, a second peak concentration at the second interface 107, and a trough concentration at a location between the first interface 105 and the second interface 107. In FIG. 6, the first peak concentration is less than the second peak concentration.

Figure 11:
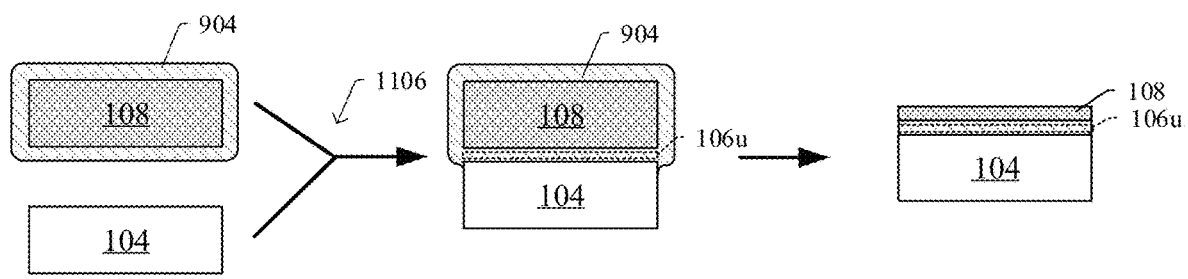
FIG. 11 illustrates a manufacturing methodology in accordance with some embodiments of FIG. 5 and FIG. 6.

In some cases, the embodiments of FIG. 5-6 can be formed according to FIG. 11, wherein a second insulating layer 904 is formed about a device substrate 108. The device substrate 108 and the second insulating layer 904 are then bonded to a handle substrate 104 (1106) so the second insulating layer 904 establishes the upper insulating region 106u. In some embodiments, an upper surface portion of the device substrate 108, and portions of the second insulating layer 904 are then removed, for example by an etch and/or a chemical mechanical planarization or grinding operation (rightmost portion of FIG. 11). More particularly, in FIG. 11, the second insulating layer 904 can be formed to include a getter material with a getter concentration profile such as shown in FIG. 6. Although FIG. 6 shows an example doping concentration profile, other example doping concentrations, such as shown and/or described in FIGS. 2A-2I for example can alternatively be used in FIG. 6.

Thus, in each of FIGS. 9-11, a handle substrate 104 is received, and a device substrate 108 is also received. At least one of the handle substrate 104 and the device substrate 108 have an insulating layer, such as the upper insulating region 106u, for example in the form of an oxide, on a face thereof, wherein the oxide layer includes metal contaminants. For example, the handle substrate 104 can include first insulating layer 902, and/or the device substrate 108 can include second insulating layer 904, wherein the first and/or second insulating layer 902/904 can include metal contaminants. The handle substrate 104 is bonded to the device substrate 108 such that the oxide layer (upper insulating region 106u) separates the handle substrate 104 from the device substrate 108. Before the handle substrate 104 is bonded to the device substrate 108, the insulating layer (902 or 904) is subjected to a gettering process in which a halogen species is provided in the insulating layer to getter away the metal contaminants. For example, the gettering process may be used during the initial formation of the first insulating layer 902 and/or second insulating layer 904, or may be used as a cleaning/purification process applied to the first insulating layer 902 and/or second insulating layer 904 after those layers are formed.

In some embodiments, the gettering process comprises subjecting the first insulating layer 902 and/or second insulating layer 904 to an atmosphere heated to a temperature ranging between 950° C. and 1150° C. for between 0.5 hours and 27 hours, wherein the atmosphere includes trans-1,2-dichlorethylene, nitrogen, and oxygen.

In some embodiments, after the gettering process, the first insulating layer 902 and/or second insulating layer 904 has a chlorine concentration profile having a first peak chlorine concentration ranging from $5\times10^{18}$ atoms/cm3 to $2\times10^{21}$ atoms/cm3 at an outer surface region of the insulating layer. The first insulating layer 902 and/or second insulating layer 904 also has a minimum chlorine concentration less than the first peak chlorine concentration in an interior region of the first insulating layer 902 and/or second insulating layer 904.

In some embodiments, the gettering process subjects the first insulating layer 902 and/or second insulating layer 904 to a first atmosphere that is heated to a first temperature ranging between 700° C. and 950° C. for 5 minutes to 30 minutes with a HCl gas flowrate of between 0.1 standard liters per minute (slm) and 10 slm, an oxygen gas flowrate of between 0.5 slm and 20 slm, and an nitrogen gas flow rate of between 1.0 slm and 30 slm. In other embodiments, the first temperature can be increased and can range between 950° C. and 1100° C. After the first insulating layer 902 and/or second insulating layer 904 is subjected to the first atmosphere, the first insulating layer 902 and/or second insulating layer 904 is subjected to a second atmosphere heated to a temperature ranging between 950° C. and 1100° C. for between 0.5 hours and 24 hours, wherein the second atmosphere includes hydrogen, nitrogen, and oxygen. In some embodiments, after the gettering process, the first insulating layer 902 and/or second insulating layer 904 has a chlorine concentration profile having a first peak chlorine concentration ranging from $5\times10^{18}$ atoms/cm3 to $2\times10^{21}$ atoms/cm3 at an outer surface region of the first insulating layer 902 and/or second insulating layer 904 and a minimum chlorine concentration less than the first peak chlorine concentration in an interior region of the insulating layer.

In some embodiments, the gettering process subjects the first insulating layer 902 and/or second insulating layer 904 to a first atmosphere that is heated to a first temperature of approximately 400° C. for 5 minutes to 30 minutes, wherein the first atmosphere includes fluorine gas. After the first insulating layer 902 and/or second insulating layer 904 is subjected to the first atmosphere, the first insulating layer 902 and/or second insulating layer 904 is subjected to a second atmosphere heated to a temperature ranging between 950° C. and 1100° C. for between 0.5 hours and 24 hours, wherein the second atmosphere includes hydrogen, nitrogen, and oxygen. In some embodiments, after the gettering process, the first insulating layer 902 and/or second insulating layer 904 has a fluorine concentration profile having a first peak fluorine concentration ranging from $1\times10^{18}$ atoms/cm3 to $1\times10^{20}$ atoms/cm3 at an outer surface region of the first insulating layer 902 and/or second insulating layer 904 and a minimum chlorine concentration less than the first peak fluorine concentration in an interior region of the first insulating layer 902 and/or second insulating layer 904.

The SOI substrates illustrated in FIGS. 1, 2A-2I, and 3-6 may be used in various contexts. For example, the SOI substrates be used with high voltage devices, BCD devices, eFlash devices, CMOS image sensors, NIR image sensors, and other devices. The high voltage devices may, for example, be devices operating at voltages greater than about 100 volts. In some embodiments, the SOI substrate 102 has a circular top layout and/or has a diameter of about 200, 300, or 450 millimeters. In other embodiments, the SOI substrate 102 has some other shape and/or some other dimensions. Further, in some embodiments, the SOI substrate 102 is a semiconductor wafer. The handle substrate 104 may be or comprise, for example, monocrystalline silicon, some other silicon material, some other semiconductor material, or any combination of the foregoing.

In some embodiments, the handle substrate 104 has a high resistance and/or a low oxygen concentration. The high resistance may, for example, be greater than about 1, 3, 4, or 9 kilo-ohms/centimeter (kΩ/cm), and/or may, for example, be about 1-4 kΩ/cm, about 4-9 kΩ/cm, or about 1-9 kΩ/cm. The low oxygen concentration may, for example, be less than about 1, 2, or 5 parts per million atoms (ppma), and/or may, for example, be between about 0.1-2.5 ppma, about 2.5-5.0 ppma, or about 0.1-5.0 ppma. The low oxygen concentration and the high resistance individually reduce substrate and/or radio frequency (RF) losses. In some embodiments, the handle substrate 104 has a low resistance. The low resistance reduces costs of the handle substrate 104 but may lead to increased substrate and/or RF losses. The low resistance may, for example, be less than about 8, 10, or 12 kΩ/cm, and/or may, for example, be between about 8-12 kΩ/cm, about 8-10 kΩ/cm, or about 10-12 kΩ/cm. In some embodiments, the handle substrate 104 is doped with p-type or n-type dopants. The resistance of the handle substrate 104 may, for example, be controlled by a doping concentration of the handle substrate 104. For example, increasing the doping concentration may decrease resistance, whereas decreasing the doping concentration may increase resistance, or vice versa. In some embodiments, a thickness $T_{hs}$ of the handle substrate 104 is about 720-780 micrometers, about 720-750 micrometers, or about 750-780 micrometers.

The insulator layer 106 overlies the handle substrate 104 and may be or comprise, for example, silicon oxide, silicon-rich oxide (SRO), some other oxide, some other dielectric, or any combination of the foregoing. In some embodiments, the insulator layer 106 completely covers an upper surface 104us of the handle substrate 104. In some embodiments, the insulator layer 106 completely encloses the handle substrate 104. The insulator layer 106 has a first insulator thickness $T_1$ at a top of the handle substrate 104, between the device layer 108 and the handle substrate 104. The first insulator thickness $T_1$ is large so as to provide a high degree of electrical insulation between the handle substrate 104 and the device layer 108. The high degree of electrical insulation may, for example, enable reduced leakage current between devices (not shown) on the device layer 108 and/or may, for example, enhance performance of the devices. In some embodiments, the first insulator thickness $T_1$ is about 0.2-2.5 micrometers, about 0.2-1.35 micrometers, or about 1.35-2.5 micrometers, and/or is greater than about 1 or 2 micrometers. In some embodiments, the insulator layer 106 has a second insulator thickness $T_2$ at a bottom of the handle substrate 104 and/or along sidewalls of the handle substrate 104. In some embodiments, the second insulator thickness $T_2$ is less than the first insulator thickness $T_1$. In some embodiments, the second insulator thickness $T_2$ is about 20-6000 angstroms, about 20-3010 angstroms, or about 3010-6000 angstroms.

In some embodiments, such as in FIG. 1 or FIG. 3 for example, the insulator layer 106 has stepped profiles at SOI edge portions 102e of the SOI substrate 102 that are respectively on opposite sides of the SOI substrate 102. In some embodiments, the insulator layer 106 has upper surfaces that are at the SOI edge portions 102e and that are recessed below a top surface of the insulator layer 106 by a vertical recess amount $VR_i$. The vertical recess amount $VR_i$ may, for example, be about 20-6000 angstroms, about 20-3010 angstroms, or about 3010-6000 angstroms. In some embodiments, the sum of the vertical recess amount $VR_i$ and the second insulator thickness $T_2$ is equal to or about equal to the first insulator thickness $T_1$. In some embodiments, the insulator layer 106 has first outer sidewalls that are at the inner edge of the SOI edge portion 102e and that are laterally recessed respectively from second outer sidewalls at an outer edge of the insulator layer 106 by an insulator lateral recess amount $LR_i$. The insulator lateral recess amount $LR_i$ may, for example, be about 0.8-1.2 millimeters, about 0.8-1.0 millimeters, or about 1.0-1.2 millimeters.

The device layer 108 overlies the insulator layer 106 and may, for example, be or comprise monocrystalline silicon, some other silicon, some other semiconductor material, or any combination of the foregoing. In some embodiments, the device layer 108 and the handle substrate 104 are the same semiconductor material (e.g., monocrystalline silicon). The device layer 108 has a thickness $T_d$ that is large. The large thickness of the device layer 108 may, for example, enable formation of large semiconductor junctions (e.g., PN junctions) upon which certain devices (e.g., NIR image sensors) may depend. In some embodiments, the thickness $T_d$ of the device layer 108 is large in that it is greater than about 0.2, 0.3, 1.0, 5.0, or 8.0 micrometers, and/or in that it is about 0.2-8.0 micrometers, about 0.2-4.0 micrometers, or about 4.0-8.0 micrometers. In some embodiments, the device layer 108 has sidewalls that are at the SOI edge portion 102e and that are laterally recessed respectively from sidewalls of the handle substrate 104 by a device lateral recess amount $LR_d$. The device lateral recess amount $LR_d$ may for example be about 1.4-2.5 millimeters, about 1.4-1.9 millimeters, or about 1.9-2.5 millimeters. Further, the device lateral recess amount $LR_d$ may, for example, be larger than or equal to the insulator lateral recess amount $LR_i$.

Figure 7:
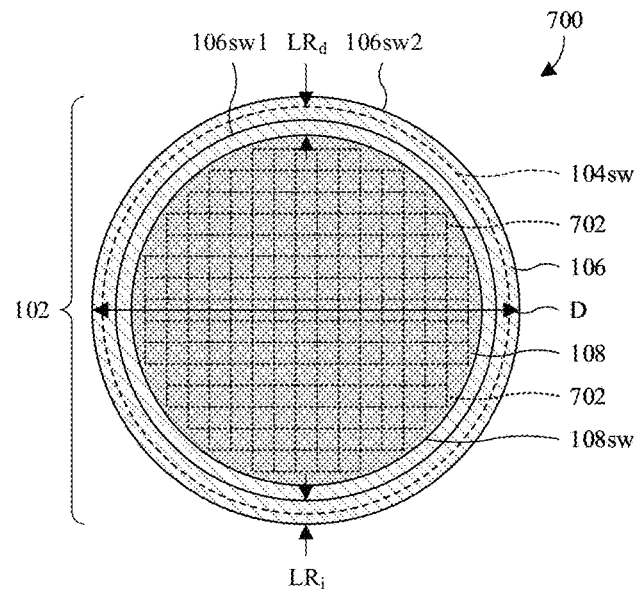
FIG. 7 illustrates a top view of some embodiments of the SOI substrate of FIG. 1.

With reference to FIG. 7, a top view 700 of some embodiments of the SOI substrate 102 of FIG. 1 is provided. The SOI substrate 102 is circular and comprises a plurality of IC dies 702 arranged in a grid across the device layer 108. For ease of illustration, only some of the IC dies 702 are labeled 702. In some embodiments, a diameter D of the SOI substrate 102 is about 150, 200, 300, or 450 millimeters. In some embodiments, a first outer sidewall 106sw1 of the insulator layer 106 is laterally recessed from a second outer sidewall 106sw2 of the insulator layer 106 by an insulator lateral recess amount $LR_i$. In some embodiments, a sidewall 108sw of the device layer 108 is laterally recessed from a sidewall 104sw (shown in phantom) of the handle substrate 104 by a device lateral recess amount $LR_d$. The insulator lateral recess amount $LR_i$ may, for example, be about 0.8-1.2 millimeters, about 0.8-1.0 millimeters, or about 1.0-1.2 millimeters. The device lateral recess amount $LR_d$ may, for example, be greater than the insulator lateral recess amount $LR_i$ and/or may, for example, be about 1.4-2.5 millimeters, about 1.4-1.9 millimeters, or about 1.9-2.5 millimeters.

Figure 8:
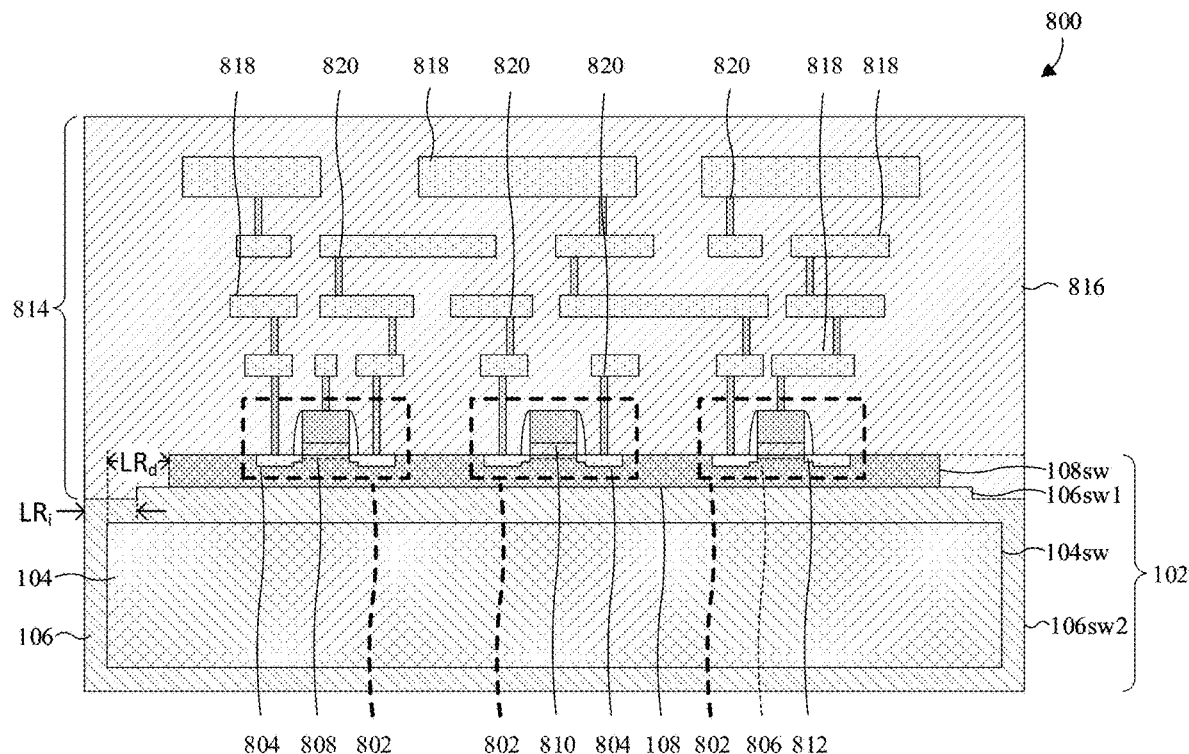
FIG. 8 illustrates a cross-sectional view of some embodiments of a semiconductor structure in which the SOI substrate of FIG. 1 finds application.

With reference to FIG. 8, a cross-sectional view 800 of some embodiments of a semiconductor structure consistent with FIG. 7 and in which the SOI substrate 102 of FIG. 1 finds application is provided. The semiconductor structure comprises a plurality of semiconductor devices 802 laterally spaced over the device layer 108. The semiconductor devices 802 may be, for example, metal-oxide-semiconductor field-effect transistor (MOSFETs), some other metal-oxide-semiconductor (MOS) devices, some other insulated-gate field-effect transistors (IGFETs), some other semiconductor devices, or any combination of the foregoing. Further, the semiconductor devices 802 may be, for example, high voltage devices, BCD devices, eFlash devices, CMOS image sensors, NIR image sensors, some other devices, or any combination of the foregoing.

In some embodiments, the semiconductor devices 802 comprise corresponding source/drain regions 804, corresponding selectively-conductive channels 806, corresponding gate dielectric layers 808, corresponding gate electrodes 810, and corresponding spacers 812. For ease of illustration, only some of the source/drain regions 804 are labeled 804, only one of the selectively-conductive channels 806 is labeled 806, only one of the gate dielectric layers 808 is labeled 808, only one of the gate electrodes 810 is labeled 810, and only one of the spacers 812 is labeled 812. The source/drain regions 804 and the selectively-conductive channels 806 are in the device layer 108. The source/drain regions 804 are respectively at ends of the selectively-conductive channels 806, and each of the selectively-conductive channels 806 extends from one of the source/drain regions 804 to another one of the source/drain regions 804. The source/drain regions 804 have a first doping type and directly adjoin portions of the device layer 108 having a second doping type opposite the first doping type.

The gate dielectric layers 808 respectively overlie the selectively-conductive channels 806, and the gate electrodes 810 respectively overlie the gate dielectric layers 808. The gate dielectric layers 808 may be or comprise, for example, silicon oxide and/or some other dielectric material, and/or the gate electrodes 810 may be or comprise, for example, doped polysilicon, metal, some other conductive material, or any combination of the foregoing. The spacers 812 overlie the source/drain regions 804 and respectively line sidewalls of the gate electrodes 810 and sidewalls of the gate dielectric layers 808. The spacers 812 may be or comprise, for example, silicon oxide, silicon nitride, silicon oxynitride, silicon carbide, some other dielectric, or any combination of the foregoing.

A back-end-of-line (BEOL) interconnect structure 814 covers the SOI substrate 102 and the semiconductor devices 802. The BEOL interconnect structure 814 comprises an interconnect dielectric layer 816, a plurality of wires 818, and a plurality of vias 820. For ease of illustration, only some of the wires 818 are labeled 818, and only some of the vias 820 are labeled 820. The interconnect dielectric layer 816 may be or comprise, for example, borophosphosilicate glass (BPSG), phosphor-silicate glass (PSG), undoped silicon glass (USG), some other low κ dielectric, silicon oxide, some other dielectric, or any combination of the foregoing. As used herein, a low κ dielectric may be or comprise, for example, a dielectric with a dielectric constant κ less than about 3.9, 3, 2, or 1.

The wires 818 and the vias 820 are alternatingly stacked in the interconnect dielectric layer 816 and define conductive paths extending to the semiconductor devices 802. The conductive paths may, for example, electrically couple the semiconductor devices 802 to other devices (e.g., other semiconductor devices), contact pads, or some other structures. The wires 818 and the vias 820 may be or comprise, for example, copper, aluminum copper, aluminum, tungsten, some other metal, or any combination of the foregoing. In some embodiments, topmost wires of the wires 818 are thicker than underlying wires of the wires 8418.

While FIGS. 7 and 8 are described with regard to embodiments of the SOI substrate 102 in FIG. 1, it is to be understood that embodiments of the SOI substrate 102 in FIG. 7-8 may alternatively be used with the SOI substrate features of FIGS. 2A-2I, and/or FIGS. 3-6.

With reference to FIGS. 12-23, a series of cross-sectional views 1200-2300 of some embodiments of a method for forming and using an SOI substrate 102 is provided. While the method is illustrated as forming embodiments of the SOI substrate 102 in FIG. 1, the method may alternatively form embodiments of the SOI substrate 102 in FIG. 3, FIG. 5, and/or other embodiments of the SOI substrate 102. Further, while the cross-sectional views 1200-2300 shown in FIGS. 12-23 are described with reference to a method, it will be appreciated that the structures shown in FIGS. 12-23 are not limited to the method and may stand alone without the method.

Figure 12:
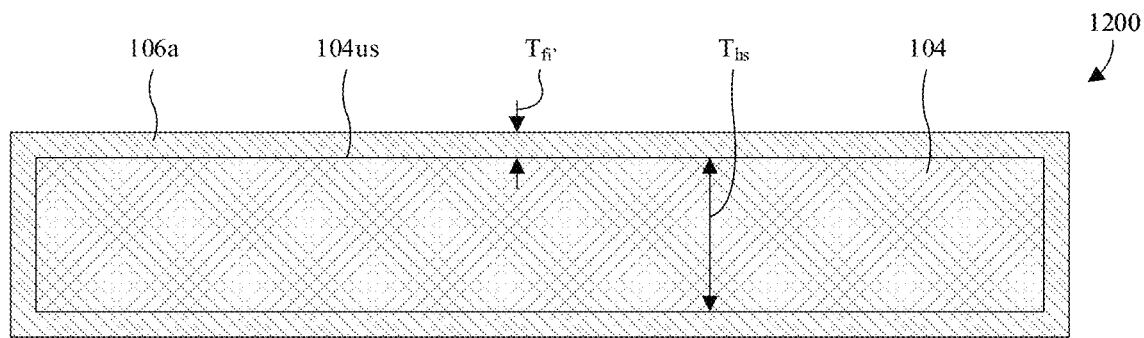
FIGS. 12-23 illustrates various embodiments of methods for forming SOI substrates.

As illustrated by the cross-sectional view 500 of FIG. 12, a handle substrate 104 is provided. In some embodiments, the handle substrate 104 is or comprises monocrystalline silicon, some other silicon material, some other semiconductor material, or any combination of the foregoing. In some embodiments, the handle substrate 104 has a circular top layout and/or has a diameter of about 200, 300, or 450 millimeters. In other embodiments, the handle substrate 104 has some other shape and/or some other dimensions. Further, in some embodiments, the handle substrate 104 is a semiconductor wafer. In some embodiments, the handle substrate 104 has a high resistance and/or a low oxygen concentration. The high resistance and the low oxygen concentration individually reduce substrate and/or RF losses. The high resistance may, for example, be greater than about 1, 3, 4, or 9 kΩ/cm, and/or may, for example, be between about 1-4 kΩ/cm, about 4-9 kΩ/cm, or about 1-9 kΩ/cm. The low oxygen concentration may, for example, be less than about 1, 2, or 5 parts per million atoms (ppma), and/or may, for example, be between about 0.1-2.5 ppma, about 2.5-5.0 ppma, or about 0.1-5.0 ppma. In some embodiments, the handle substrate 104 has a low resistance to reduce substrate costs since a high resistance substrate may, for example, be costlier than a low resistance substrate. The low resistance may, for example, be less than about 8, 10, or 12 kΩ/cm, and/or may, for example, be about 8-12 kΩ/cm, about 8-10 kΩ/cm, or about 10-12 kΩ/cm. In some embodiments, the handle substrate 104 is doped with p-type or n-type dopants. The resistance of the handle substrate 104 may, for example, be controlled by a doping concentration of the handle substrate 104. In some embodiments, a thickness $T_{hs}$ of the handle substrate 104 is about 720-780 micrometers, about 720-750 micrometers, or about 750-780 micrometers.

Also illustrated by the cross-sectional view 1200 of FIG. 12, a first insulator layer 106a is formed on an upper surface 104us of the handle substrate 104. In some embodiments, the first insulator layer 106a completely covers the upper surface 104us of the handle substrate 104. In at least some embodiments where the handle substrate 104 has the high resistance, completely covering the upper surface 104us may, for example, prevent arcing during plasma processing performed hereafter. In some embodiments, the first insulator layer 106a completely encloses the handle substrate 104. In some embodiments, the first insulator layer 106a is or comprises silicon oxide and/or some other dielectric. In some embodiments, a thickness $T_{fi}$, of the first insulator layer 106a is about 0.2-2.0 micrometers, about 0.2-1.1 micrometers, or about 1.1-2.0 micrometers.

In some embodiments, a process for forming the first insulator layer 106a comprises depositing the first insulator layer 106a by thermal oxidation, chemical vapor deposition (CVD), physical vapor deposition (PVD), some other deposition process, or any combination of the foregoing. For example, the first insulator layer 106a may be deposited by a dry oxidation process using oxygen gas (e.g., $0_2$) or some other gas as an oxidant. As another example, the first insulator layer 106a may be deposited by a wet oxidation process using water vapor as an oxidant. In some embodiments, the first insulator layer 106a is formed at temperatures of about 800-1100 degrees Celsius (° C.), about 800-950° C., or about 950-1100° C. For example, where the first insulator layer 106a is formed by thermal oxidation (e.g., any one of the wet and dry oxidation processes), the first insulator layer 106a may be formed at these temperatures.

Figure 13:
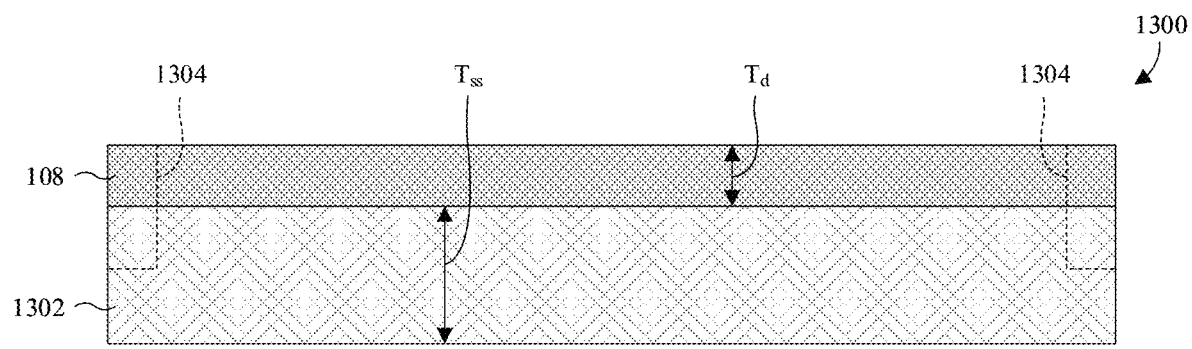

As illustrated by the cross-sectional view 1300 of FIG. 13, a sacrificial substrate 1302 is provided. In some embodiments, the sacrificial substrate 1302 is or comprises monocrystalline silicon, some other silicon material, some other semiconductor material, or any combination of the foregoing. In some embodiments, the sacrificial substrate 1302 is doped with p-type or n-type dopants and/or has a low resistivity. The low resistance may, for example, be less than about 0.01 or 0.02 kΩ/cm and/or may, for example, be about 0.01-0.2 kΩ/cm. In some embodiments, the sacrificial substrate 1302 has a lower resistance than the handle substrate 104. In some embodiments, the sacrificial substrate 1302 has a circular top layout and/or has a diameter of about 200, 300, or 450 millimeters. In other embodiments, the sacrificial substrate 1302 has some other shape and/or some other dimensions. In some embodiments, the sacrificial substrate 1302 is a bulk semiconductor substrate and/or is a semiconductor wafer. In some embodiments, a thickness $T_{ss}$ of the sacrificial substrate 1302 is about 720-780 micrometers, about 720-750 micrometers, or about 750-780 micrometers. In some embodiments, the thickness $T_{ss}$ of the sacrificial substrate 1302 is the same or about the same as the thickness $T_{hs}$ of the handle substrate 104.

Also illustrated by the cross-sectional view 13600 of FIG. 13, a device layer 108 is formed on the sacrificial substrate 1302. The device layer 108 has a thickness $T_d$. In some embodiments, the thickness $T_d$ is about 0.7-10.0 micrometers, about 0.7-5.0 micrometers, or about 5.0-10.0 micrometers, and/or is greater than about 0.7, 5.0, or 10.0 micrometers. In some embodiments, the device layer 108 is or comprises monocrystalline silicon, some other silicon material, some other semiconductor material, or any combination of the foregoing. In some embodiments, the device layer 108 is or comprises the same semiconductor material as the sacrificial substrate 1302, has the same doping type as the sacrificial substrate 1302, has a lower doping concentration than the sacrificial substrate 1302, or any combination of the foregoing. For example, the sacrificial substrate 1302 may be or comprise P+ monocrystalline silicon, whereas the device layer 108 may be or comprise P− monocrystalline silicon. In some embodiments, the device layer 108 has a low resistance. The low resistance may, for example, be greater than that of the sacrificial substrate 1302. Further, the low resistance may, for example, be less than about 8, 10, or 12 kΩ/cm, and/or may, for example, be about 8-12 kΩ/cm, about 8-10 kΩ/cm, or about 10-12 kΩ/cm. In some embodiments, the device layer 108 has the same doping type, the same doping concentration, the same resistivity, or any combination of the foregoing as the handle substrate 104. In some embodiments, a process for forming the device layer 108 comprises molecular beam epitaxy (MBE), vapor phase epitaxy (VPE), liquid phase epitaxy (LPE), some other epitaxial process, or any combination of the foregoing.

Figure 14:
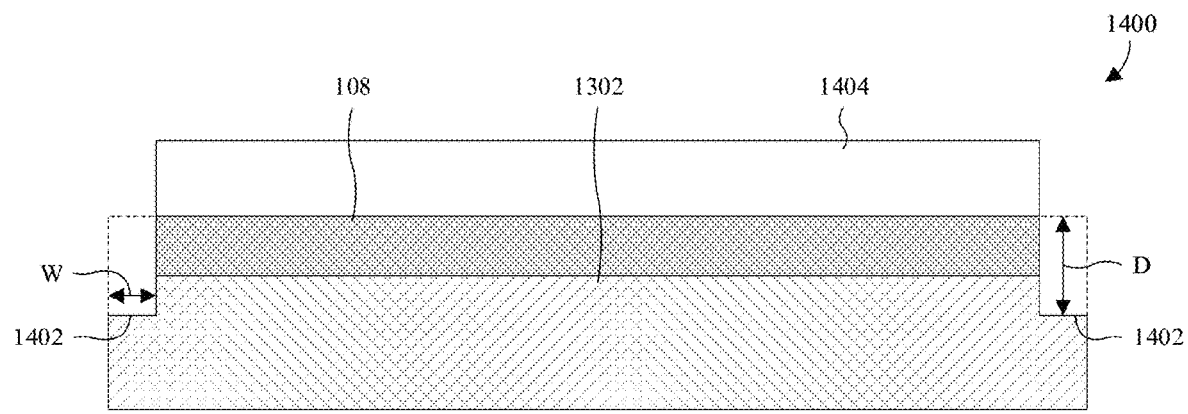

As illustrated by the cross-sectional view 1400 of FIG. 14, the device layer 108 and the sacrificial substrate 1302 are patterned. The patterning removes edge regions 1304 defined by the device layer 108 and the sacrificial substrate 1302. By removing the edge regions 1304, defects are prevented from forming at the edge regions 1304 during subsequent grinding and/or chemical wet etching. The edge defects have a propensity to concentrate at the edge regions 604 and negatively impact the quality of the device layer 108. Further, the patterning forms a ledge 1402 at an edge of the sacrificial substrate 1302. The ledge 1402 is defined by the sacrificial substrate 1302 and has a pair of ledge segments respectively on opposite sides of the sacrificial substrate 1302. In some embodiments, the ledge 1402 has a top layout that extends along an edge of the sacrificial substrate 1302 in a ring-shaped path or some other closed path. In some embodiments, the ledge 1402 has a width W of about 0.8-1.2 millimeters, about 0.8-1.0 millimeters, or about 1.0-1.2 millimeters. In some embodiments, the ledge 1402 is recessed below an upper or top surface of the device layer 108 by a distance D of about 30-120 micrometers, about 30-75 micrometers, or about 75-120 micrometers. In some embodiments, the ledge 1402 is further recessed below an upper or top surface of the sacrificial substrate 1302.

In some embodiments, the patterning is performed by a photolithography/etching process or some other patterning process. Further, in some embodiments, the patterning comprises forming a mask 1404 over the device layer 108, performing an etch into the device layer 108 and the sacrificial substrate 1302 with the mask 1404 in place, and removing the mask 1404. The mask 1404 may, for example, be formed so the device layer 108 and the sacrificial substrate 1302 are completely covered except for at the edge regions 1304. In some embodiments, the mask 1404 is or comprise silicon nitride, silicon oxide, some other hard mask material, photoresist, some other mask material, or any combination of the foregoing. In some embodiments, the mask 1404 is formed using a wafer edge exposure (WEE) process tool. For example, a process for forming the mask 1404 may comprise: depositing a photoresist layer on the device layer 108; selectively exposing an edge portion of the photoresist layer to radiation using the WEE process tool; and developing the photoresist layer to form the mask 1404.

Figure 15:
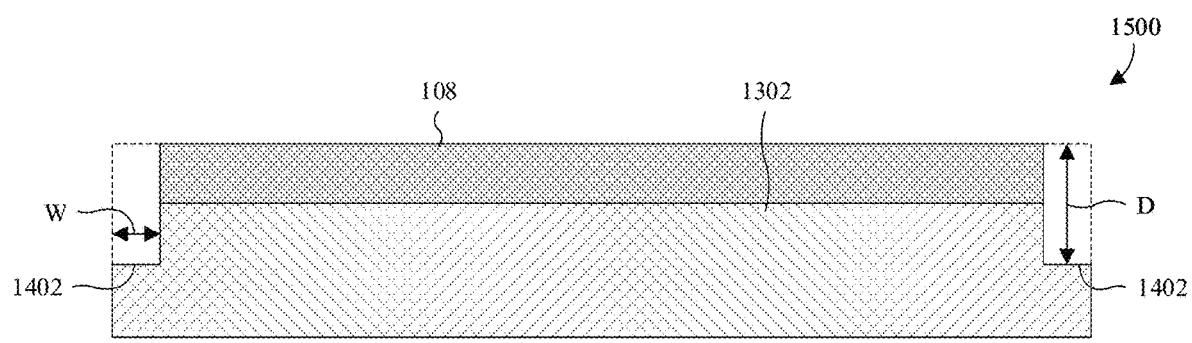

As illustrated by the cross-sectional view 1500 of FIG. 15, the device layer 108 and the sacrificial substrate 1302 are cleaned to remove etch residue and/or other undesired byproducts produced while performing preceding processes. In some embodiments, the cleaning process scrubs the device layer 108 and the sacrificial substrate 1302 using a physical brush or a water jet. In some embodiments, the cleaning process cleans the device layer 108 and the sacrificial substrate 1302 using a chemical solution. The chemical solution may, for example, be or comprise hydrofluoric acid or some other chemical solution. In some embodiments, the cleaning increases the distance D at which the ledge 1402 is recessed below the upper or top surface of the device layer 108.

Figure 16:
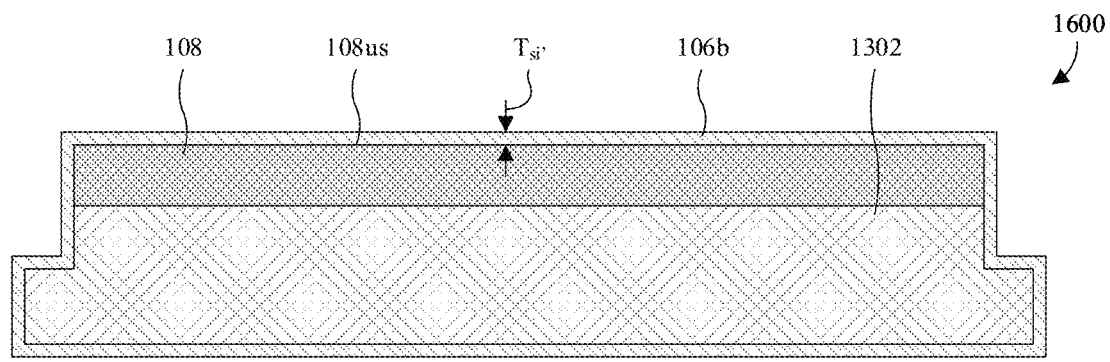

As illustrated by the cross-sectional view 1600 of FIG. 16, a second insulator layer 106b is formed on an upper surface 108us of the device layer 108. In some embodiments, the second insulator layer 106b completely covers the upper surface 108us of the device layer 108. In some embodiments, the second insulator layer 106b completely encloses the sacrificial substrate 1302 and the device layer 108. In some embodiments, the second insulator layer 106b is or comprises silicon oxide and/or some other dielectric. In some embodiments, the second insulator layer 106b is the same dielectric material as the first insulator layer 106a. In some embodiments, a thickness $T_{si'}$ of the second insulator layer 106b is about 20-6000 angstroms, about 20-3010 angstroms, or about 3010-6000 angstroms.

In some embodiments, a process for forming the second insulator layer 106b comprises depositing the second insulator layer 106b by thermal oxidation, CVD, PVD, some other deposition process, or any combination of the foregoing. For example, the second insulator layer 106b may be deposited by a dry oxidation process using oxygen gas (e.g., $O_2$) or some other gas as an oxidant. As another example, the second insulator layer 106b may be deposited by a wet oxidation process using water vapor as an oxidant. In some embodiments, the second insulator layer 106b is formed at temperatures of about 750-1100° C., about 750-925° C., or about 925-1100° C. For example, where the second insulator layer 106b is formed by thermal oxidation (e.g., any one of the wet and dry oxidation processes), the second insulator layer 106b may be formed at these temperatures. In some embodiments, the second insulator layer 106b is formed at a temperature less than that of the first insulator layer 106a.

Figure 17:
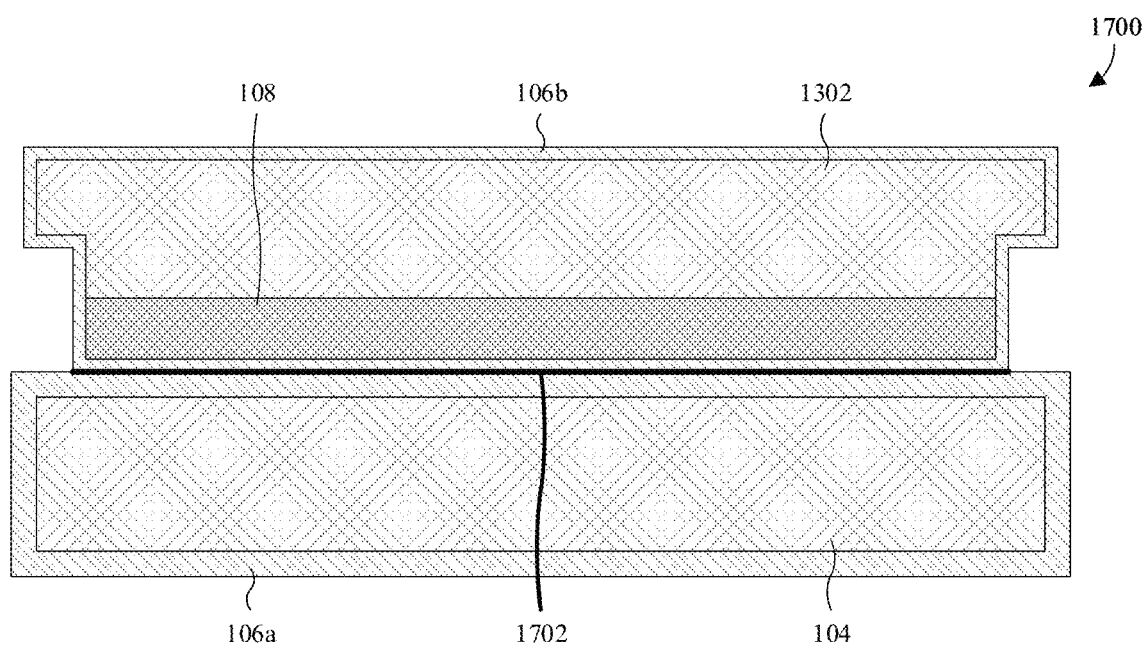

As illustrated by the cross-sectional view 1700 of FIG. 17, the sacrificial substrate 1302 is bonded to the handle substrate 104, such that the device layer 108, the first insulator layer 106a, and the second insulator layer 106b are between the handle substrate 104 and the sacrificial substrate 1302. The bonding presses the first and second insulator layers 106a, 106b together and forms a bond 1702 at an interface at which the first insulator layer 106a and the second insulator layer 106b directly contact. The bonding may, for example, be performed by fusion bonding, vacuum bonding, or some other bonding process. The fusion bonding may, for example, be performed with a pressure at about 1 standard atmosphere (atm), about 0.5-1.0 atm, about 1.0-1.5, or about 0.5-1.5 atm. The vacuum bonding may, for example, be performed with a pressure at about 0.5-100 millibars (mBar), about 0.5-50 mBar, or about 50-100 mBar.

In some embodiments, a bond anneal is performed to strengthen the bond 1702. In some embodiments, the bond anneal is performed at a temperature of about 300-1150° C., about 300-725° C., or about 735-1150° C. In some embodiments, the bond anneal is performed for about 2-5 hours, about 2-3.5 hours, or about 3.5-5 hours. In some embodiments, the bond anneal is performed with a pressure at about 1 atm, about 0.5-1.0 atm, about 1.0-1.5, or about 0.5-1.5 atm. In some embodiments, the bond anneal is performed while nitrogen gas (e.g., $N_2$) and/or some other gas flows over the structure of FIG. 17. The flow rate for the gas may, for example, about 1-20 standard litre per minute (slm), about 1-10 slm, or about 10-20 slm.

Figure 18:
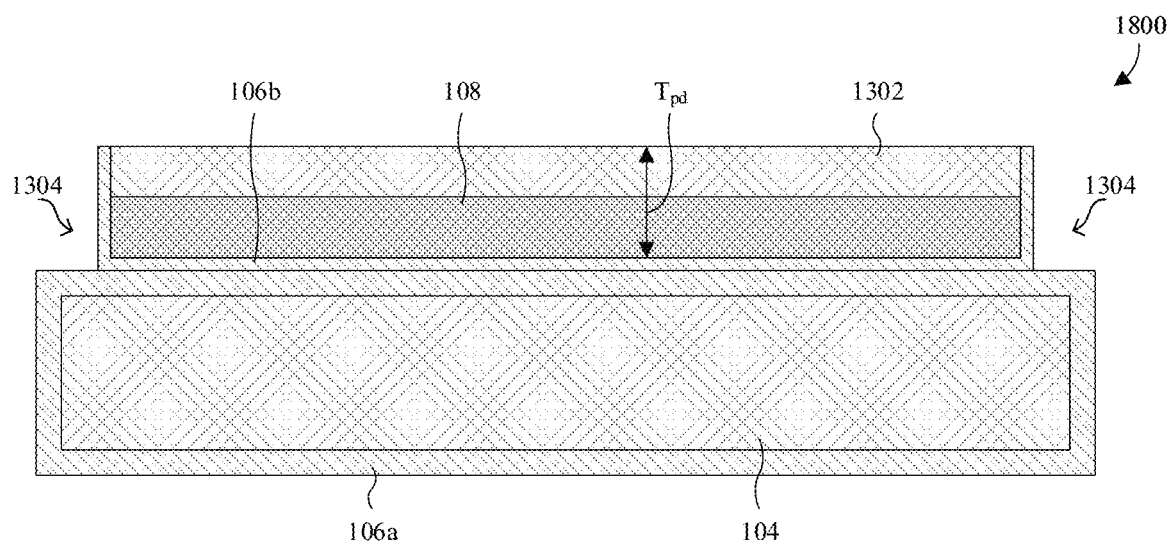

As illustrated by the cross-sectional view 1800 of FIG. 18, a first thinning process is performed into the second insulator layer 106b and the sacrificial substrate 1302. The first thinning process removes an upper portion of the second insulator layer 106b, and further removes an upper portion of the sacrificial substrate 1302. In some embodiments, the first thinning process is performed into the second insulator layer 106b and the sacrificial substrate 1302 until the device layer 108 and the sacrificial substrate 1302 collectively have a predetermined thickness $T_{pd}$. The predetermined thickness $T_{pd}$ may, for example, about 20-45 micrometers, about 20-32.5 micrometers, or about 32.5-45 micrometers.

In some embodiments, the first thinning process is partially or wholly performed by a mechanical grinding process. In some embodiments, the first thinning process is performed partially or wholly performed by a chemical mechanical polish (CMP). In some embodiments, the first thinning process is performed by a mechanical grinding process followed by a CMP. As noted above, removal of the edge region prevents edge defects from forming at the edge region 1304 during the grinding. The edge defects have a propensity to form and concentrate at the edge region 604 during the grinding and negatively impact the quality of the device layer 108.

Figure 19:
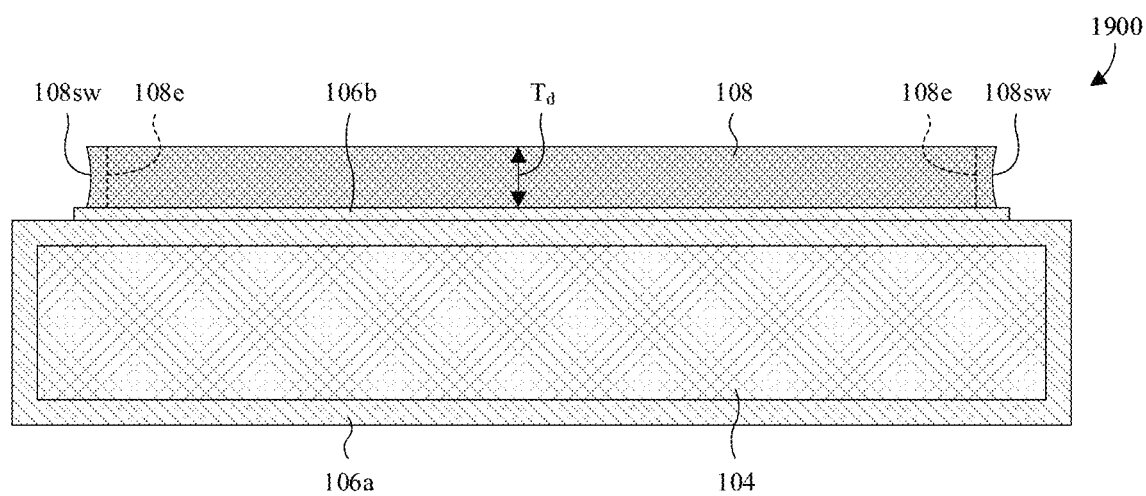

As illustrated by the cross-sectional view 1900 of FIG. 19, an etch is performed into the sacrificial substrate 1302. The etch stops on the device layer 108 and remove the sacrificial substrate 1302. In some embodiments, the etch further removes a portion of the second insulator layer 106b on sidewalls of the sacrificial substrate 1302 and sidewalls of the device layer 108. Further, in some embodiments, the etch laterally etches sidewalls 108sw of the device layer 108. Due to the lateral etching, the sidewalls 108sw of the device layer 108 may, for example, be curved and/or concave. Upon completion of the etch, the thickness $T_d$ of the device layer 108 may, for example, be about 0.6-9.5 micrometers, about 0.6-5.05 micrometers, or about 5.05-9.5 micrometers. In some embodiments, the etch minimally reduces the thickness $T_d$ of the device layer 108 due to, for example, over etching.

In some embodiments, the etch is performed by a hydrofluoric/nitric/acetic (HNA) etch, some other wet etch, a dry etch, or some other etch. The HNA etch may, for example, etch the sacrificial substrate 1302 with a chemical solution comprising hydrofluoric acid, nitric acid, and acetic acid. The etch has a first etch rate for material of the sacrificial substrate 1302, and further has a second etch rate for material of the device layer 108 that is less than the first etch rate. In some embodiments, the first etch rate is about 90-100, 90-95, or 95-100 times greater than the second etch rate. These embodiments of the first and second etch rates may, for example, arise when the first etch is performed by the HNA etch, the sacrificial substrate 1302 is or comprises P+ monocrystalline silicon, and the device layer 108 is or comprises P− monocrystalline silicon.

Due to the use of the etch (e.g., the HNA etch) to remove the sacrificial substrate 1302, the removal of the sacrificial substrate 1302 may, for example, be highly controlled. Therefore, the thickness $T_d$ of the device layer 108 may, for example, be highly uniform across the device layer and a total thickness variation (TTV) of the device layer 108 may, for example, be low. The TTV may, for example, be low in that it is less than about 500 or 1500 angstroms. In some embodiments, the TTV decreases with the thickness $T_d$ of the device layer 108. For example, the TTV may be less than about 500 angstroms where the thickness $T_d$ of the device layer 108 is less than about 3000 angstroms, and the TTV may be greater than about 500 angstroms, but less than about 1500 angstroms, where the thickness $T_d$ of the device layer 108 is more than about 3000 angstroms.

Figure 20:
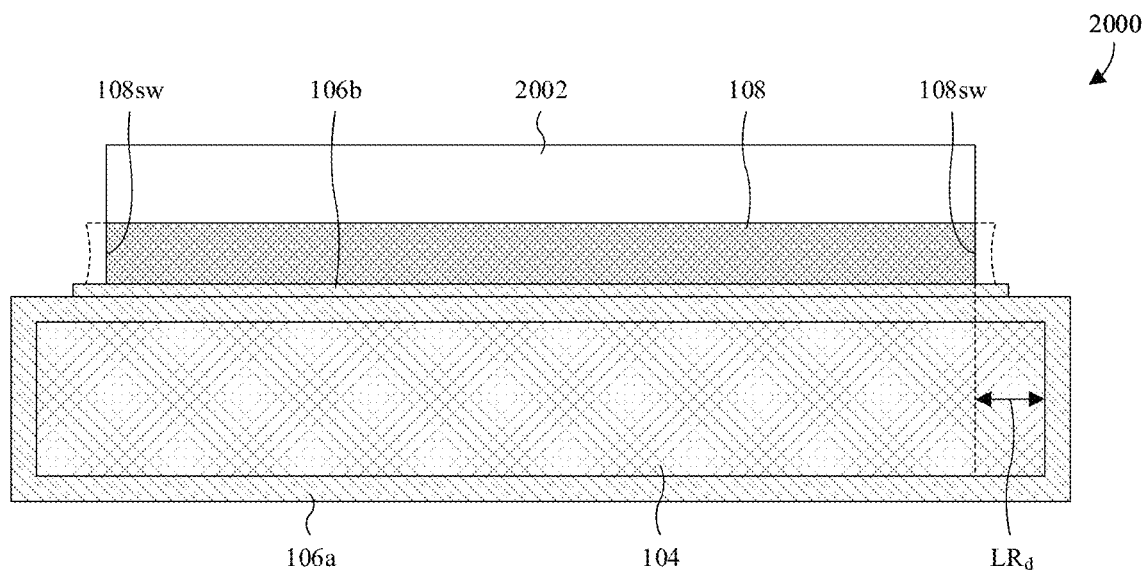

As illustrated by the cross-sectional view 2000 of FIG. 20, the device layer 108 is patterned. The patterning removes edge portions 108e of the device layer 108. By removing the edge portions 108e, edge defects that form at the edge portions 108e during the etch are removed. The edge defects reduce the quality of the device layer 108 and form due to lateral etching into the sidewalls 108sw of the device layer 108 during the etch. The patterning further laterally recesses the sidewalls 108sw of the device layer 108. In some embodiments, after removing the edge portions 108e, the sidewalls 108sw of the device layer 108 are laterally recessed respectively from sidewalls of the handle substrate 104 by a device lateral recess amount $LR_d$. The device lateral recess amount $LR_d$ may, for example, be about 1.4-2.5 millimeters, about 1.4-1.95 millimeters, or about 1.95-2.5 millimeters.

In some embodiments, the patterning is performed by a photolithography/etching process or some other patterning process. Further, in some embodiments, the patterning comprises forming a mask 2002 over the device layer 108, performing an etch into the device layer 108 with the mask 2002 in place, and removing the mask 2002. The mask 2002 may, for example, be or comprise silicon nitride, silicon oxide, some other hard mask material, photoresist, some other mask material, or any combination of the foregoing. The mask 2002 may, for example, be formed so the device layer 108 is completely covered, except for at the edge portions 108e, and/or may, for example, be formed using a wafer edge exposure (WEE) process tool. In some embodiments, a process for forming the mask 2002 using the WEE process tool comprises: depositing a photoresist layer on the device layer 108; selectively exposing an edge portion of the photoresist layer to radiation using the WEE process tool; and developing the photoresist layer to form the mask 2002. The etch may, for example, be performed by a dry etch or some other etch, and/or may, for example, stop on the first and second insulator layers 106a, 106b. In some embodiments where the handle substrate 104 has a high resistance (e.g., a resistance greater than about 1 kΩ/cm) and the etch is performed using a dry etch, the first and second insulator layers 106a, 106b prevent arcing by completely covering and/or completely enclosing the handle substrate 104. The mask 2002 may, for example, be removed by plasma ashing or some other removal. The plasma ashing may, for example, comprise exposure of the mask 2002 to 02 plasma and may, for example, be performed when mask 2002 is or comprise photoresist.

In some embodiments, a cleaning process is performed after the patterning to remove etch residue and/or other undesired byproducts produced during the patterning. In some embodiments, the cleaning process removes oxide that forms on the device layer 108 during the patterning. The cleaning process may, for example, perform the cleaning using hydrofluoric (HF) acid or some other chemical solution. Hydrogen fluoride may, for example, make about up 0.1-2.0%, about 0.1-1.0%, or about 1.0-2.0% of the HF acid by volume. A remainder of the HF acid may, for example, be deionized water or some other water.

Figure 21:
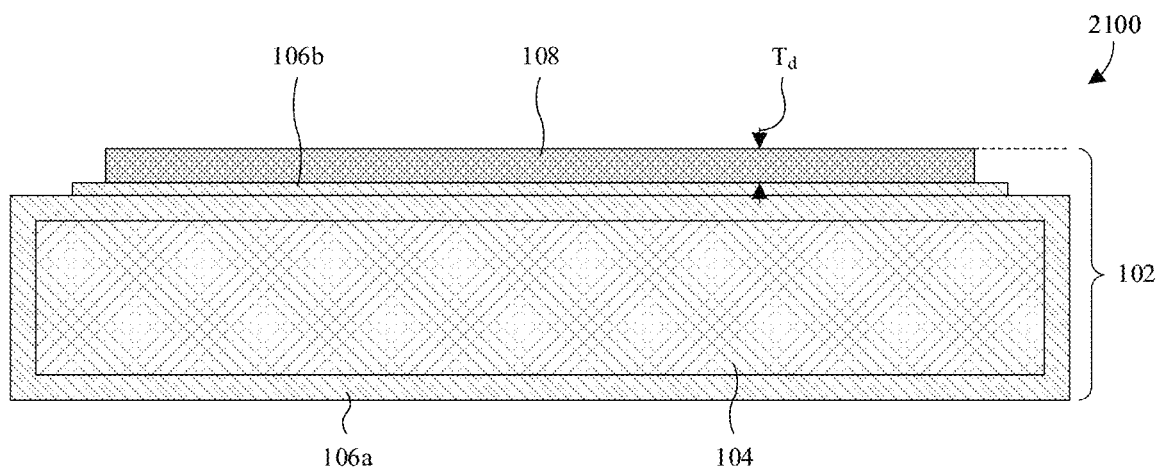

As illustrated by the cross-sectional view 2100 of FIG. 21, a second thinning process is performed into the device layer 108 to reduce the thickness $T_d$ of the device layer 108. In some embodiments, the second thinning process reduces the thickness $T_d$ to about 0.3-8.0 micrometers, about 0.3-4.15 micrometers, or about 4.15-8.0 micrometers, and/or to greater than about 0.3, 1.0, 2.0, 5.0, or 8.0 micrometers. Collectively, the device layer 108, the first insulator layer 106a, the second insulator layer 106b, and the handle substrate 104 define an SOI substrate 102. In some embodiments, the second thinning process is performed by a CMP, some other thinning process, or any combination of the foregoing.

Because the device layer 108 is formed by epitaxy and transferred to the handle substrate 104, the device layer 108 may be formed with a large thickness (e.g., a thickness greater than about 0.3 micrometers). Epitaxy is not subject to the thickness restrictions associated with other approaches for forming the device layer. Further, because the epitaxy is not affected by the thickness of the first and second insulator layers 106a, 106b, the first and second insulator layers 106a may be individually and/or collectively formed with a large thickness (e.g., a thickness greater than about 1 micrometer). The large thickness of the device layer 108 may, for example, enable formation of large semiconductor junctions (e.g., PN junctions) upon which certain devices (e.g., NIR image sensors) may depend. The large thickness of the first and second insulator layers 106a may, for example, facilitate enhanced electrical isolation between devices on the device layer 108 and/or reduce leakage current between the devices. Devices that may benefit from the large thicknesses include, for example, high voltage devices, BCD devices, eFlash devices, CMOS image sensors, NIR image sensors, some other devices, or any combination of the foregoing.

Figure 22:
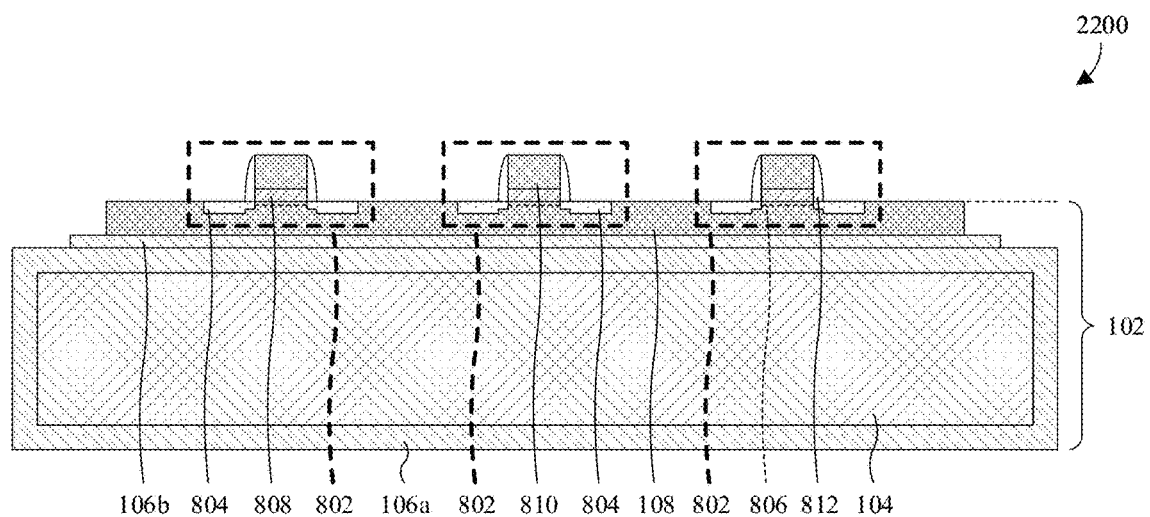
Figure 23:
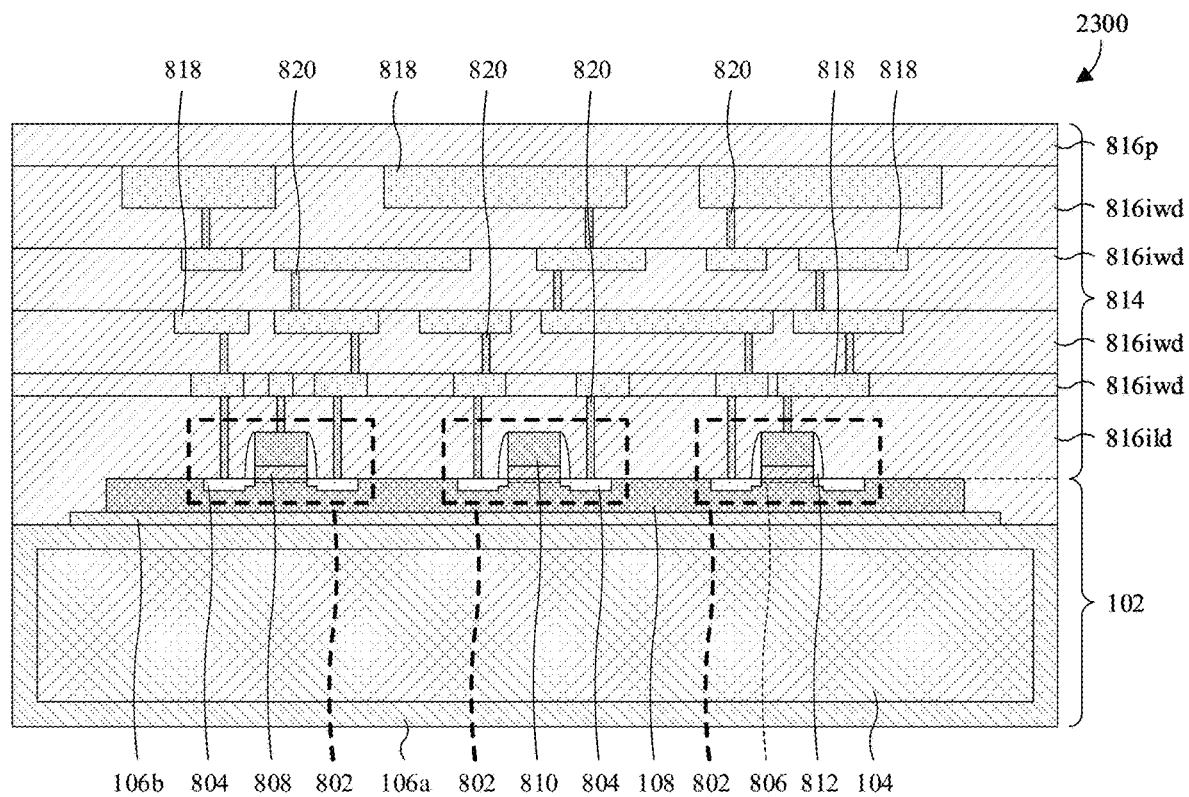

As illustrated by the cross-sectional 2200 of FIG. 22, a plurality of semiconductor devices 802 are formed on the device layer 108. In some embodiments in which the handle substrate 104 has a high resistance (e.g., a resistance greater than about 1 kΩ/cm), the first and second insulator layers 106a, 106b prevent arcing during plasma processing (e.g., plasma etching) performed to form the semiconductor devices 802 by completely covering and/or completely enclosing the handle substrate 104. The semiconductor devices 802 may be, for example, high voltage devices, BCD devices, eFlash devices, CMOS image sensors, NIR image sensors, some other devices, or any combination of the foregoing. The high voltage devices may, for example, be devices that operate at more than about 100 volts.

In some embodiments, the semiconductor devices 802 comprise corresponding source/drain regions 804, corresponding selectively-conductive channels 806, corresponding gate dielectric layers 808, corresponding gate electrodes 810, and corresponding spacers 812. For ease of illustration, only some of the source/drain regions 804 are labeled 804, only one of the selectively-conductive channels 806 is labeled 806, only one of the gate dielectric layers 808 is labeled 808, only one of the gate electrodes 810 is labeled 810, and only one of the spacers 812 is labeled 812. The source/drain regions 804 and the selectively-conductive channels 806 are in the device layer 108. The source/drain regions 804 are respectively at ends of the selectively-conductive channels 806, and each of the selectively-conductive channels 806 extends from one of the source/drain regions 804 to another one of the source/drain regions 804. The gate dielectric layers 808 respectively overlie the selectively-conductive channels 806, and the gate electrodes 810 respectively overlie the gate dielectric layers 808. The spacers 812 overlie the source/drain regions 804 and respectively line sidewalls of the gate electrodes 810.

In some embodiments, a process for forming the semiconductor devices 802 comprises depositing a dielectric layer covering the device layer 108, and further depositing a conductive layer covering the dielectric layer. The conductive layer and the dielectric layer are patterned (e.g., by a photolithography/etching process) into the gate electrodes 810 and the gate dielectric layers 808. Dopants are implanted into the device layer 108 with the gate electrodes 810 in place to define lightly doped portions of the source/drain regions 804, and a spacer layer is formed covering the source/drain regions 804 and the gate electrodes 810. The spacer layer is etched back to form the spacers 812, and dopants are implanted into the device layer 108 with the spacers 812 in place to expand the source/drain regions 804.

Thus, some embodiments of the present disclosure relate to a semiconductor-on-insulator (SOI) substrate including a handle substrate, a device layer overlying the handle substrate, and an insulator layer separating the handle substrate from the device layer. The insulator layer meets the device layer at a first interface and meets the handle substrate at a second interface. The insulator layer comprises a getter material having a getter concentration profile. The getter concentration profile has a first peak concentration at the first interface, a second peak concentration at the second interface and a trough concentration at a location between the first interface and the second interface. The trough concentration is less than each of the first peak concentration and the second peak concentration.

Other embodiments relate to a method for forming a semiconductor-on-insulator (SOI) substrate. In the method, a handle substrate is received. A device substrate is also received, wherein at least one of the handle substrate and the device substrate have an oxide layer on a face thereof. The oxide layer includes metal contaminants. The handle substrate is bonded to the device substrate such that the oxide layer separates the handle substrate from the device substrate. Before the handle substrate is bonded to the device substrate, the oxide layer is subjected to a gettering process in which a halogen species is provided in the oxide layer to getter away the metal contaminants.

Still other embodiments relate to an integrated circuit include a handle substrate, an insulator layer disposed over the handle substrate, and a device layer comprising monocrystalline silicon disposed over the insulator layer. One or more semiconductor devices are disposed in or over the device layer, and an interconnect structure is disposed over the device layer. The interconnect structure operably couples the one or more semiconductor devices to one another. The insulator layer separates the handle substrate from the device layer, and the insulator layer comprises a getter material embedded in insulating material of the insulator layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor-on-insulator (SOI) substrate comprising:
   a handle substrate comprising getter material;
   a device layer overlying a central portion of the handle substrate, but not overlying a peripheral region of the handle substrate; and
   an insulator layer separating the handle substrate from the device layer, the insulator layer meeting the device layer at a first interface and meeting the handle substrate at a second interface, wherein at least a portion of the insulator layer comprises the getter material;
   wherein the insulator layer includes a central insulator region that is directly between the central portion of the handle substrate and the device layer, and includes a peripheral insulator region that is directly over the peripheral region of the handle substrate, wherein the central insulator region has a central region thickness as measured perpendicular from the first interface to the second interface and wherein the peripheral insulator region has a peripheral region thickness as measured perpendicular from an upper surface of the handle substrate, the central region thickness being greater than the peripheral region thickness.

2. The SOI substrate of claim 1:
   wherein the device layer is disposed over an upper surface of the handle substrate; and
   wherein the insulator layer covers the upper surface of the handle substrate to separate the upper surface of the handle substrate from the device layer, covers a lower surface of the handle substrate, and covers sidewalls of the handle substrate.

3. The SOI substrate of claim 2, wherein the getter material in the insulator layer exhibits a getter concentration profile; wherein the getter concentration profile has a first peak concentration at the first interface, a second peak concentration at the second interface and a trough concentration at a location between the first interface and the second interface, the trough concentration being less than each of the first peak concentration and the second peak concentration.

4. The SOI substrate of claim 3, wherein the second interface corresponds to a point where the upper surface of the handle substrate meets the insulator layer, and the first peak concentration is less than the second peak concentration.

5. The SOI substrate of claim 4, wherein the getter material is present in the device layer at a first concentration, and is present in the handle substrate at a second concentration, the first concentration being less than the second concentration.

6. The SOI substrate of claim 3, wherein the first peak concentration is equal to the second peak concentration.

7. The SOI substrate of claim 6, wherein the insulator layer is confined between the device layer and the handle substrate, such that a lowermost surface of the insulator layer corresponds to an uppermost surface of the handle substrate, and an uppermost surface of the insulator layer corresponds to a lowermost surface of the device layer.

8. The SOI substrate of claim 3, wherein the first peak concentration and the second peak concentration are each at least $1 \times 10^{18}$ atoms/cm$^3$ of chlorine or fluorine, and the trough concentration ranges between $1 \times 10^{14}$ atoms/cm$^3$ and $2 \times 10^{17}$ atoms/cm$^3$.

9. The SOI substrate of claim 3, wherein the getter material comprises chlorine or fluorine.

10. A semiconductor-on-insulator (SOI) wafer comprising:
    a handle wafer comprising getter material;
    a device layer overlying a central region of the handle wafer, the device layer having outer sidewalls disposed over the handle wafer such that the device layer does not extend over a peripheral region of the handle wafer; and
    an insulator layer separating the handle wafer from the device layer, the insulator layer including a peripheral insulator region directly over the peripheral region of the handle wafer and a central insulator region directly over the central region of the handle wafer, wherein the central insulator region is thicker than the peripheral insulator region and has outer sidewalls aligned with outer sidewalls of the device layer.

11. The SOI wafer of claim 10:
    wherein the handle wafer includes a first circumferential outer edge defined by a first radius when viewed from above;
    wherein the device layer includes a second circumferential outer edge defined by a second radius, the second radius being smaller than the first radius and the second circumferential outer edge being concentric with regards to the first circumferential outer edge and bounded by the first circumferential outer edge when viewed from above.

12. The SOI wafer of claim 11, wherein the second circumferential outer edge of the device layer corresponds to a sidewall step in the insulator layer where the peripheral region meets the central region.

13. The SOI wafer of claim 11, further comprising:
    a plurality of semiconductor devices disposed in the device layer; and
    an interconnect structure comprising vias and metal wires disposed over the device layer, wherein the interconnect structure operably couples two or more of the plurality of semiconductor devices to one another.

14. The SOI wafer of claim 10, wherein thicknesses of the peripheral insulator region and the central insulator region are measured perpendicular to an upper surface of the handle wafer.

15. A semiconductor-on-insulator (SOI) substrate comprising:
    a handle substrate;
    an insulator structure disposed over and in direct contact with an upper surface of the handle substrate; and
    a device layer disposed over and in direct contact with an upper surface of the insulator structure,
    wherein the insulator structure includes an upper insulator region nearest the device layer and a lower insulator region nearest the handle substrate, the upper insulator region having a first getter doping curve and the lower insulator region having a second getter doping curve that differs from the first getter doping curve.

16. The SOI substrate of claim 15, wherein the first getter doping curve and the second getter doping curve meet at an inflection point.

17. The SOI substrate of claim 15, wherein the handle substrate includes a first circumferential outer edge and the device layer includes a second circumferential outer edge that is concentric with regards to the first circumferential outer edge and bounded by the first circumferential outer edge when viewed from above.

18. The SOI substrate of claim 17, wherein the insulator structure includes a peripheral region and a central region that are both disposed over the handle substrate, wherein the peripheral region has a peripheral region thickness as measured perpendicular to an upper surface of the handle substrate and the central region has a central region thickness as measured perpendicular to the upper surface of the handle substrate, the central region thickness being greater than the peripheral region thickness.

19. The SOI substrate of claim 18, wherein the second circumferential outer edge of the device layer corresponds to a sidewall step in the insulator structure where the peripheral region meets the central region.

20. The SOI substrate of claim 17, further comprising:
  a plurality of semiconductor devices disposed in the device layer; and
  an interconnect structure comprising vias and metal wires disposed over the device layer, wherein the interconnect structure operably couples two or more of the plurality of semiconductor devices to one another.

* * * * *